(12) United States Patent
Kwon et al.

(10) Patent No.: US 11,785,798 B2
(45) Date of Patent: Oct. 10, 2023

(54) DISPLAY WITH DAM SURROUNDING OPENING

(71) Applicant: Samsung Display Co., Ltd., Yongin-si (KR)

(72) Inventors: Hoi Soo Kwon, Pyeongtaek-si (KR); Sun Young Kim, Cheonan-si (KR); Seung Hwan Kim, Cheonan-si (KR); Hwi Seong Kim, Seongnam-si (KR); Yu Jin Ye, Asan-si (KR); Jae-Man Lee, Anyang-si (KR); Hee-Won Yoon, Asan-si (KR)

(73) Assignee: Samsung Display Co., Ltd., Yongin-si (KR)

(*) Notice: Subject to any disclaimer, the term of this patent is extended or adjusted under 35 U.S.C. 154(b) by 10 days.

(21) Appl. No.: 17/243,003

(22) Filed: Apr. 28, 2021

(65) Prior Publication Data
US 2022/0131106 A1 Apr. 28, 2022

(30) Foreign Application Priority Data
Oct. 27, 2020 (KR) .......................... 10-2020-0140520

(51) Int. Cl.
*H01L 51/52* (2006.01)
*H10K 50/844* (2023.01)
(Continued)

(52) U.S. Cl.
CPC .......... *H10K 50/844* (2023.02); *H10K 50/15* (2023.02); *H10K 50/16* (2023.02); *H10K 50/17* (2023.02); *H10K 50/171* (2023.02); *H10K 59/122* (2023.02); *H10K 59/124* (2023.02); *H10K 71/00* (2023.02); *H10K 77/10* (2023.02); *H10K 59/1201* (2023.02)

(58) Field of Classification Search
CPC ................................................... H01L 51/5253
See application file for complete search history.

(56) References Cited

U.S. PATENT DOCUMENTS

| 6,369,495 B2 | 4/2002 | Codama et al. |
| 2020/0144539 A1* | 5/2020 | Park ...................... H10K 50/80 |

(Continued)

FOREIGN PATENT DOCUMENTS

| CN | 1700823 A | * 11/2005 | ......... H01L 27/0248 |
| CN | 110021742 A | 7/2019 | |

(Continued)

*Primary Examiner* — Peter Bradford
(74) *Attorney, Agent, or Firm* — Lewis Roca Rothgerber Christie LLP

(57) ABSTRACT

A display device includes: a substrate including an opening area, a peripheral area surrounding the opening area, and a display area surrounding the peripheral area; a transistor overlapping the display area on the substrate; an insulation layer on the transistor; a first electrode on the insulation layer; a pixel definition layer on the first electrode; an intermediate layer and a second electrode that overlap the first electrode and include a functional layer; a dam overlapping the peripheral area; and a first layer overlapping the peripheral area and spaced apart from the intermediate layer, wherein the first layer is spaced apart from an upper surface of the dam and covers a side surface of the dam.

20 Claims, 18 Drawing Sheets

(51) Int. Cl.
*H10K 50/15* (2023.01)
*H10K 50/16* (2023.01)
*H10K 50/17* (2023.01)
*H10K 59/122* (2023.01)
*H10K 59/124* (2023.01)
*H10K 71/00* (2023.01)
*H10K 77/10* (2023.01)
*H10K 59/12* (2023.01)

(56) References Cited

U.S. PATENT DOCUMENTS

| | | | | |
|---|---|---|---|---|
| 2020/0176520 A1* | 6/2020 | Kim | ............... | H01L 51/5253 |
| 2021/0111231 A1* | 4/2021 | Choi | ............... | H01L 51/5253 |
| 2021/0134912 A1* | 5/2021 | Kim | ............... | H01L 27/3258 |
| 2021/0193958 A1* | 6/2021 | Wang | ............... | H01L 51/5253 |
| 2021/0202880 A1* | 7/2021 | Kim | ............... | H01L 51/0046 |

FOREIGN PATENT DOCUMENTS

| | | | |
|---|---|---|---|
| CN | 110649180 A | 1/2020 |
| KR | 10-2011-0065856 A | 6/2011 |
| KR | 10-2015-0002341 A | 1/2015 |
| KR | 10-2020-0067576 A | 6/2020 |
| KR | 10-2020-0102580 A | 9/2020 |
| KR | 10-2021-0044359 A | 4/2021 |

\* cited by examiner

FIG. 16

| Not occurring | | | |
|---|---|---|---|
| 1,000 mJ/cm² | 1,200 ~ 1,400 mJ/cm² | 1,600 mJ/cm² | 1,800 mJ/cm² |

DISPLAY WITH DAM SURROUNDING OPENING

CROSS-REFERENCE TO RELATED APPLICATION

The present application claims priority to and the benefit of Korean Patent Application No. 10-2020-0140520 filed in the Korean Intellectual Property Office on Oct. 27, 2020, the entire contents of which are incorporated herein by reference.

BACKGROUND

1. Field

Aspects of some embodiments of the present disclosure relate to a display device.

2. Description of the Related Art

Recently, as various portable electronic devices include a camera function, instances of consumers carrying only one electronic device in which a camera function is embedded is rapidly increasing rather than consumers separately carrying a camera.

In some devices, a camera, a flash, a speaker, a photosensor, etc., may be provided outside a display area of an electronic device, so that a space for the electronic device to display an image decreases.

The above information disclosed in this Background section is only for enhancement of understanding of the background and therefore the information discussed in this Background section does not necessarily constitute prior art.

SUMMARY

Aspects of some embodiments may include a display device that may have a relatively wide or large area capable of displaying images in the display device including an opening area. Aspects of some embodiments may include a display device in which a dead space around an opening area is relatively reduced.

Aspects of some embodiments include a display device including: a substrate including an opening area, a peripheral area surrounding the opening area, and a display area surrounding the peripheral area; a transistor overlapping the display area and on the substrate; an insulation layer on the transistor; a first electrode on the insulation layer; a pixel definition layer on the first electrode; an intermediate layer and a second electrode that overlap the first electrode and include a functional layer; a dam overlapping the peripheral area; and a first layer overlapping the peripheral area and spaced apart from the intermediate layer, wherein the first layer is spaced apart from an upper surface of the dam and covers a side surface of the dam.

According to some embodiments, an end of the first layer may further protrude than an upper surface of the dam.

According to some embodiments, the display device may further include an encapsulation layer on the second electrode; the encapsulation layer may include a first encapsulation inorganic layer, an encapsulation organic layer; and a second encapsulation inorganic layer, and an end of the second electrode may overlap the encapsulation organic layer.

According to some embodiments, the first layer may include a first area exposing the upper surface of the dam, and a second area exposing a portion of the insulation layer.

According to some embodiments, the first encapsulation inorganic layer may be in the first area on the upper surface of the dam.

According to some embodiments, the first encapsulation inorganic layer may contact the insulation layer exposed in the second area, and may have a step.

According to some embodiments, an end of the second electrode overlapping the peripheral area may be rolled up.

According to some embodiments, the dam may include a plurality of dams having different heights.

According to some embodiments, the first area may overlap at least one of the plurality of dams.

According to some embodiments, the display device may further include an inorganic insulation layer between the transistor and the substrate, and the second area may expose the inorganic insulation layer.

According to some embodiments, the display device may further include a second layer that is in the peripheral area and includes the same material as the second electrode.

According to some embodiments, ends of the substrate, the inorganic insulation layer, the first encapsulation inorganic layer, and the second encapsulation inorganic layer may define an inner surface of the opening area.

According to some embodiments a display device includes: a substrate including an opening area, a peripheral area surrounding the opening area, and a display area surrounding the peripheral area; a transistor on the substrate; an insulation layer on the transistor; a first electrode on the insulation layer; a pixel definition layer on the first electrode; an intermediate layer and a second electrode that overlap the first electrode and include a functional layer; a plurality of dams in the peripheral area; and a first layer in the peripheral area, wherein the first layer is spaced apart from the plurality of dams adjacent thereto, and the first layer exposes an upper surface of at least one of the plurality of dams.

According to some embodiments, the first layer may cover side surfaces of the plurality of dams.

According to some embodiments, the display device may further include an encapsulation layer on the second electrode, wherein the encapsulation layer may include a first encapsulation inorganic layer, an encapsulation organic layer, and a second encapsulation inorganic layer, and the first encapsulation inorganic layer may contact upper surfaces of the plurality of dams in the peripheral area.

According to some embodiments, the first layer may include an end protruding from the upper surface of the dam.

According to some embodiments, the first layer may include a first area exposing the upper surface of the dam in the peripheral area.

According to some embodiments, the first encapsulation inorganic layer may contact the end of the first layer and the upper surface of the dam in the first area, and may have a step.

According to some embodiments, the first layer may include a second area exposing at least a portion of the insulation layer in the peripheral area.

According to some embodiments, the first encapsulation inorganic layer may contact the insulation layer exposed in the second area, and may have a step.

According to some embodiments, the functional layer may include at least one of a hole injection layer, a hole transporting layer, an electron transporting layer, or an electron injection layer.

According to some embodiments, the first layer may include the same material as at least one of the hole injection layer, the hole transporting layer, the electron transporting layer, or the electron injection layer.

According to the embodiments, it may be possible to reduce a peripheral area surrounding an opening area and to provide a relatively wide display area.

BRIEF DESCRIPTION OF THE DRAWINGS

FIG. 16 illustrates an image of whether carbonization occurs according to an energy density of a laser irradiated according to some embodiments.

DETAILED DESCRIPTION

Figure 1:
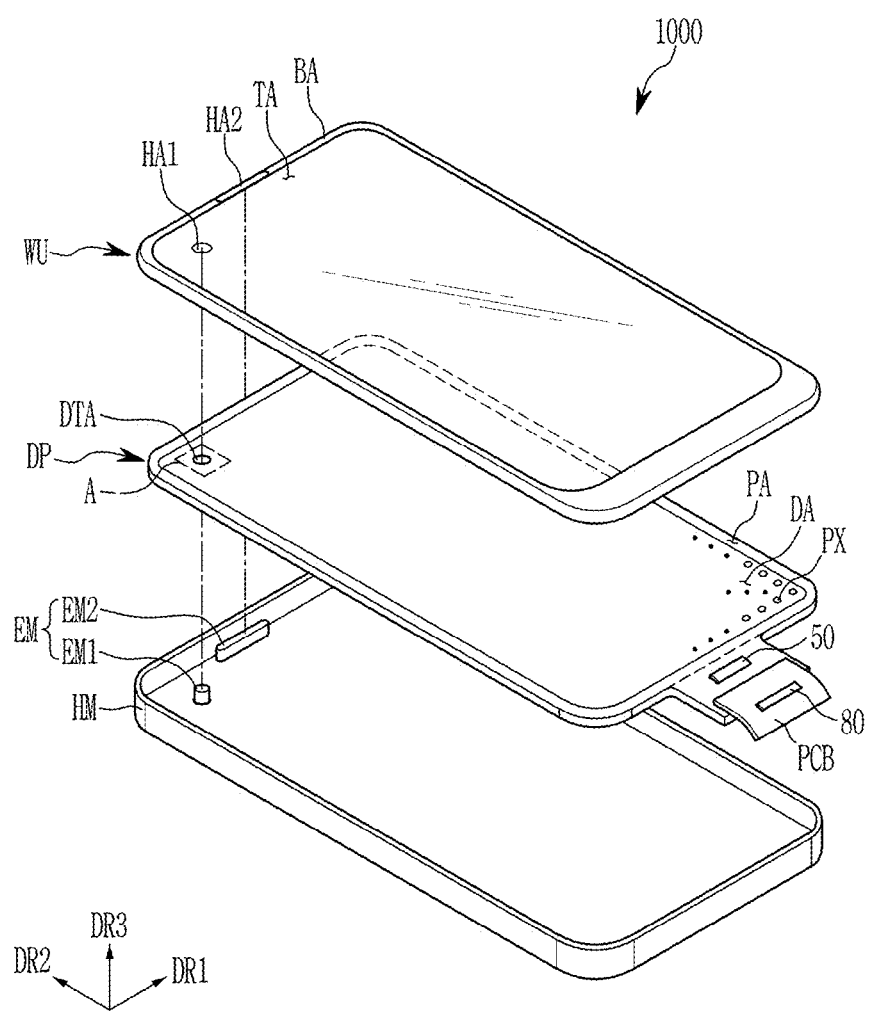
FIG. 1 illustrates an exploded perspective view of a display device according to some embodiments.

Aspects of some embodiments of the present invention will be described more fully hereinafter with reference to the accompanying drawings, in which embodiments of the invention are shown. As those skilled in the art would realize, the described embodiment may be modified in various different ways, all without departing from the spirit and scope of embodiments according to the present invention.

In order to more clearly describe the present invention, certain characteristics or components, whose description may not be necessary to enable a person having ordinary skill in the art to make and use embodiments according to the present disclosure, such descriptions may be omitted, and identical or similar constituent elements throughout the specification are denoted by the same reference numerals.

Further, in the drawings, the size and thickness of each element are arbitrarily illustrated for ease of description, and the present disclosure is not necessarily limited to those illustrated in the drawings. In the drawings, the thicknesses of layers, films, panels, regions, areas etc., are exaggerated for clarity. In the drawings, for ease of description, the thicknesses of some layers and areas are exaggerated.

It will be understood that when an element such as a layer, film, region, area or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

Hereinafter, aspects of a display device according to some embodiments will be described in more detail with reference to FIG. 1 to FIG. 3. FIG. 1 illustrates an exploded perspective view of a display device according to some embodiments, and FIG. 2 illustrates a schematic cross-sectional view of a display device according to some embodiments, and FIG. 3 illustrates a top plan view of some constituent elements of a display panel according to some embodiments.

Figure 2:
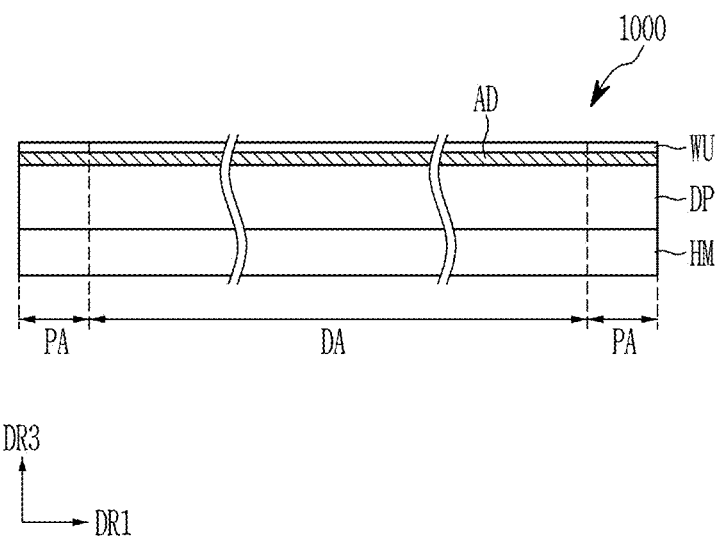
FIG. 2 illustrates a schematic cross-sectional view of a display device according to some embodiments.
Figure 3:
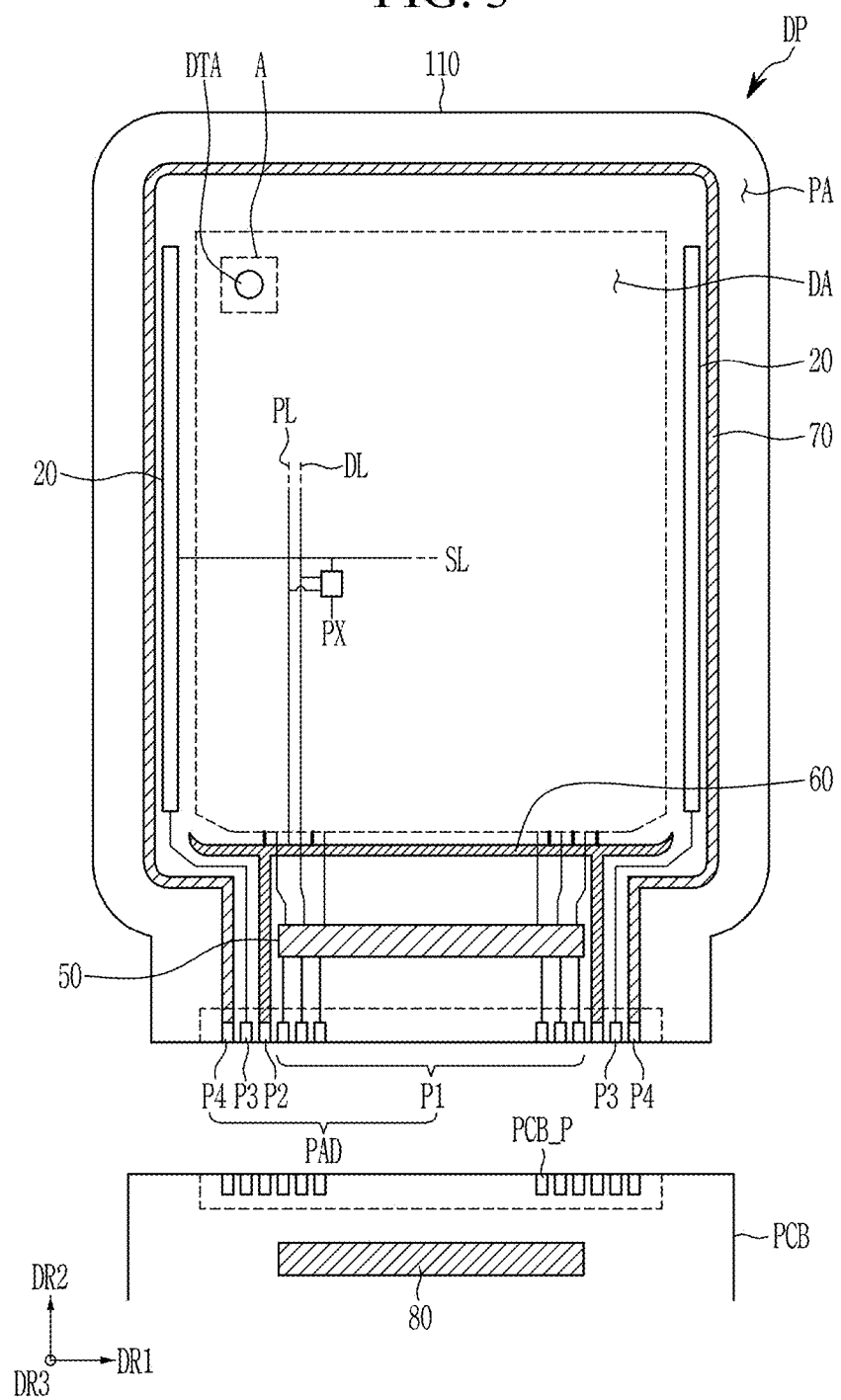
FIG. 3 illustrates a top plan view of some constituent elements of a display panel according to some embodiments.

First, referring to FIG. 1 and FIG. 2, a display device 1000 displays an image toward a third direction DR3 on a plane defined by a first direction DR1 and a second direction DR2. A front surface (or upper surface) and a back surface (or lower surface) of each member are divided by the third direction DR3. Directions indicated by the first to third direction DR1, DR2, and DR3 are relative concepts, thus they may be changed into other directions.

The display device 1000 includes a cover window WU, a display panel DP, and a housing member HM. According to some embodiments, the cover window WU, the display panel DP, and the housing member HM may be combined to form the display device 1000.

The cover window WU is located on the display panel DP to protect the display panel DP. The cover window WU may include a transmissive area TA and a blocking area BA. The transmissive area TA may be an optically transparent area, and may be an area that transmits incident light. The blocking area BA may be an area having relatively low light transmittance compared to the transmissive area TA. The blocking area BA defines a shape of the transmissive area TA. The blocking area BA may surround the transmissive area TA. The blocking area BA may display a color (e.g., a set or predetermined color). The blocking area BA overlaps a non-display area PA of the display panel DP to block the non-display area PA from being viewed from the outside.

The cover window WU may include a first hole area HA1 and a second hole area HA2. Each of the first hole area HA1 and the second hole area HA2 may overlap an electronic module EM to be described later. The electronic module EM may operate by receiving external signals provided through the first hole area HA1 and the second hole area HA2.

According to some embodiments, the first hole area HA1 may be located in the transmissive area TA, and the second hole area HA2 may be located in the blocking area BA. However, this is only illustrative, and the first hole area HA1 and the second hole area HA2 may be located in opposite areas, all of them may be located in the transmissive area TA, or all of them may be located in the blocking area BA.

In each of the first hole area HA1 and the second hole area HA2, a depression (e.g, a set or predetermined depression) recessed from a rear surface of the cover window WU may be defined. The depression may include a groove portion or an opening area having a depth smaller than a thickness of the cover window WU.

The first hole area HA1 and the second hole area HA2 may have different shapes. The first hole area HA1 may have a circular shape in a plan view, and the second hole area HA2 may have an elliptical shape having a long axis extending along the first direction DR1 in a plan view. However, the shapes of the first hole area HA1 and the second hole area HA2 are not limited thereto, and the sizes or shapes thereof may be variously changed.

The display panel DP may be a flat rigid display panel, but is not limited thereto, and may be a flexible display panel. The display panel according to some embodiments of the present invention may be a light emitting type of display panel, but embodiments according to the present disclosure are not particularly limited thereto. For example, the display panel may be an organic light emitting display panel or a quantum dot light emitting display panel. A light emitting layer included in an intermediate layer of the organic light emitting display panel may include an organic light emitting material. The light emitting layer included in an intermediate layer of the quantum dot light emitting display panel may include a quantum dot and a quantum rod. Hereinafter, the display panel will be described as an organic light emitting display panel.

An image is displayed on the front surface of the display panel DP. The front surface of the display panel DP includes a display area DA and a non-display area PA. An image is displayed on the display area DA. The non-display area PA may surround the display area DA.

The display panel DP may include a plurality of pixels PX located in the display area DA. The pixels PX may display light in response to an electrical signal. The light displayed by the pixels PX may realize an image. The number of transistors and capacitors included in one pixel PX and their connection relationship may be variously changed.

The display panel DP according to some embodiments may include an opening area DTA penetrating through the display panel DP. The opening area DTA may be located in the display area DA. Hereinafter, area "A" in which the opening area DTA is located will be described in more detail later. The opening area DTA may overlap the first hole area HA1 of the cover window WU. Some of the plurality of pixels PX may be arranged to surround the opening area DTA. Accordingly, an image may be displayed even in an area adjacent to the opening area DTA.

The display panel DP is extended from the display area DA to include the non-display area PA in which a plurality of signal lines and a pad part are located. A data driver 50 may be located in the non-display area PA. According to some embodiments, the pad part of the non-display area PA may be electrically connected to a printed circuit board PCB including a driving chip 80, which will be described in more detail below with reference to FIG. 3.

As shown in FIG. 2, an adhesive layer AD for bonding the display panel DP and the cover window WU may be located between the display panel DP and the cover window WU. Meanwhile, according to some embodiments, a touch unit located between the display panel DP and the cover window WU may be further included. The touch unit may be located on the display panel DP for a touchscreen function of the display device 1000. The touch unit may include a touch electrode of various patterns, and may be formed in a resistive film type or a capacitive type.

The electronic module EM includes various functional modules for operating the display device 1000. The electronic module EM may be electrically connected to the display panel DP through a connector or the like. For example, the electronic module EM may be a camera, a speaker, or a sensing sensor using light or heat.

The electronic module EM may include a first electronic module EM1 and a second electronic module EM2. The first electronic module EM1 may sense an external subject received through the opening area DTA and the first hole area HA1. The first electronic module EM1 may receive an external input transmitted through the opening area DTA and the first hole area HA1, or may provide an output through the opening area DTA and the first hole area HA1.

For example, the first electronic module EM1 may be at least one of a light emitting module, a light sensing module, or a photographing module. For example, the first electronic module EM1 may include at least one of a light emitting module for outputting infrared rays, a CMOS sensor for sensing infrared rays, or a camera module for photographing an external subject.

The second electronic module EM2 may collect a sound signal such as voice through the second hall area HA2, or may provide a sound signal such as processed voice to the outside. For example, the second electronic module EM2 may include at least one of a sound input module or a sound output module. The sound input module may include a microphone capable of receiving a sound signal. The sound output module may include a speaker that outputs sound data as a sound signal.

However, this is illustrated as an example, and the electronic module EM may be configured of a single module, may further include a greater number of electronic modules, may be arranged in various arrangement relationships, but is not limited to any one embodiment.

The housing member HM is located at a lower side of the display panel DP. The housing member HM is combined with the cover window WU to form an appearance of the display device 1000. The housing member HM may contain a material with relatively high rigidity. For example, the housing member HM may include a plurality of frames and/or plates made of glass, plastic, and metal.

The housing member HM provides an accommodation space (e.g., a set or predetermined accommodation space). The display panel DP may be accommodated in the accommodation space to be protected from external impact.

Referring to FIG. 3, the display panel DP includes a substrate 110 including the display area DA and the non-display area PA. The non-display area PA may be defined along an edge of the display area DA.

The display panel DP includes the plurality of pixels PX. The plurality of pixels PX may be located in the display area DA on the substrate 110. Each of the pixels PX includes a light emitting element and a driving circuit connected to the light emitting element. Each pixel PX emits, for example, red, green, blue, or white light, and may include an organic light emitting element (organic light emitting diode) as an example.

The display panel DP may include a plurality of signal lines and a pad part. The plurality of signal lines may include a scan line SL extending in the first direction DR1, and a data line DL and a driving voltage line PL extending in the second direction DR2.

A scan driver 20 generates a scan signal to transmit it to each pixel PX through the scan line SL. According to some embodiments, the scan driver 20 may be located at left or right sides of the display area DA. In the present specification, a structure in which the scan driver 20 is located at both sides of the substrate 110 is shown, but according to some embodiments, the scan driver may be located only at one side of the substrate 110.

A pad part PAD is located at one end portion of the display panel DP, and includes a plurality of terminals P1, P2, P3, and P4. The pad part PAD may be exposed without being covered by an insulation layer to be electrically connected to the printed circuit board PCB. The pad part PAD may be electrically connected to a pad part PCB_P of the printed circuit board PCB. The printed circuit board PCB may transmit a signal or power source of an IC driving chip 80 to the pad part PAD.

A controller converts a plurality of image signals transmitted from the outside into a plurality of image data signals, and transmits the converted signals to the data driver 50 through the terminal P1. In addition, the controller may receive a vertical synchronization signal, a horizontal synchronization signal, and a clock signal, and generate a control signal for controlling operations of the scan driver 20 and the data driver 50 to transmit it to each of the scan driver 20 and the data driver 50 through the terminals P3 and P1. The controller transmits a driving voltage ELVDD to a driving voltage supply wire 60 through the terminal P2. In addition, the controller transmits a common voltage ELVSS to each common voltage supply wire 70 through the terminal P4.

The data driver 50 is located on the non-display area PA, and generates a data signal to transmit it to each pixel PX. The data driver 50 may be located at one side of the display panel DP, and for example, may be located between the pad part PAD and the display area DA.

The driving voltage supply wire 60 is located on the non-display area PA. For example, the driving voltage supply wire 60 may be located between the data driver 50 and the display area DA. The driving voltage supply wire 60 provides the driving voltage ELVDD to the pixels PX. The driving voltage supply wire 60 may be arranged in the first direction DR1, and may be connected to a plurality of driving voltage lines PL arranged in the second direction DR2.

The common voltage supply wire 70 is located on the non-display area PA. The common voltage supply wire 70 may have a shape surrounding the substrate 110. The common voltage supply wire 70 transmits the common voltage ELVSS to one electrode (for example, a second electrode) of the light emitting element included in the pixel PX.

Figure 4:
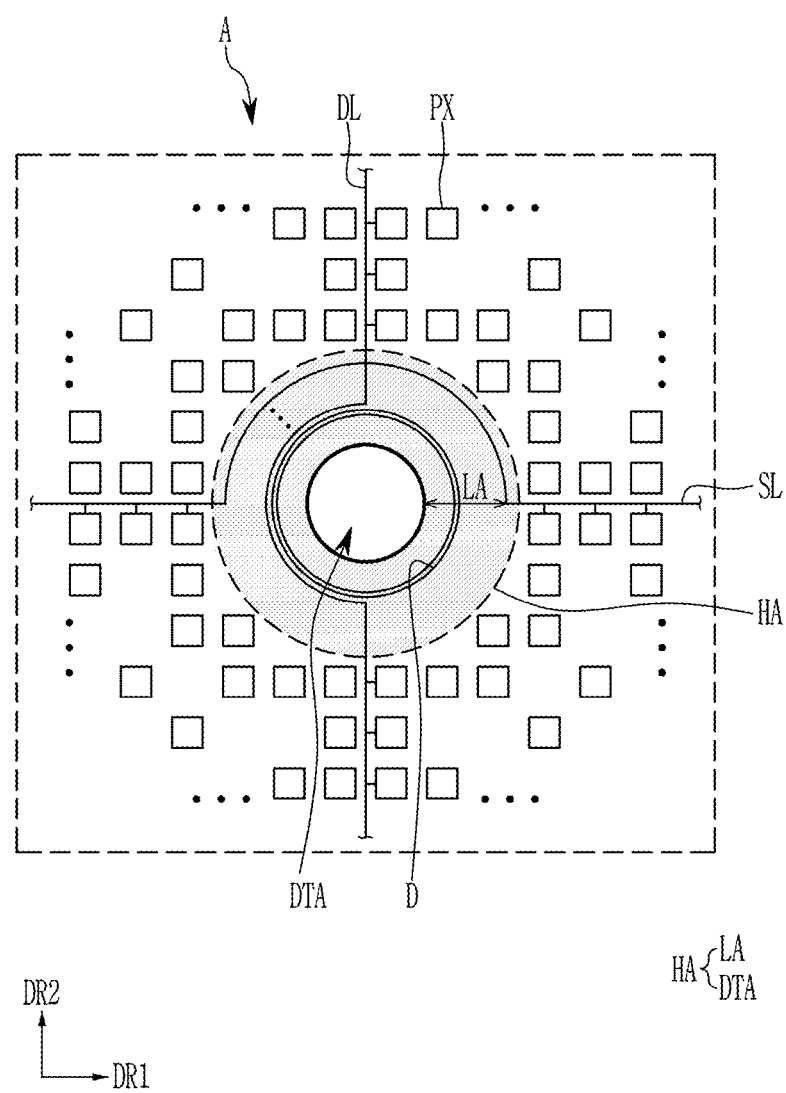
FIG. 4 illustrates a top plan view in which area "A" of FIG. 1 and enlarged aspects of the components illustrated in FIG. 3 according to some embodiments.

Hereinafter, area "A" including the opening area DTA shown in FIG. 3 will be described with reference to FIG. 4. FIG. 4 illustrates a top plan view in which area "A" of FIG. 1 and FIG. 3 is enlarged.

Referring to FIG. 4 together with the above-described drawings, the display panel DP includes a plurality of signal lines SL and DL and a plurality of pixels PX located on the substrate. Each of the plurality of pixels PX may be connected to the plurality of signal lines SL and DL. FIG. 4 illustrates an example of a scan line SL and a data line DL among a plurality of signal lines. However, this is illustrated as an example, and each of the pixels PX according to some embodiments of the present invention may be additionally connected to various different corresponding signal lines, and is not limited to any one embodiment.

The hole area HA included in the display panel DP includes the opening area DTA and the peripheral area LA surrounding the opening area DTA.

The peripheral area LA is an area surrounding a periphery of the opening area DTA. When a laser is irradiated to form the opening area DTA, the peripheral area LA may allow wires to not be damaged. A minimum width of the peripheral area LA is required to be maintained at a constant width. Meanwhile, the peripheral area LA includes a dam D. FIG. 4 illustrates one dam D, but embodiments according to the present invention are not limited thereto, and may include a plurality of dams D.

The scan line SL and the data line DL may have a semicircular structure, overlap the peripheral area LA, and bypass the opening area DTA. The plurality of scan lines SL extend in a horizontal direction along a periphery of the opening area DTA. Here, the plurality of scan lines SL may include a scan line, a light emitting control line, an initialization voltage line, and the like according to signals. The plurality of data lines DL extend in a vertical direction along the periphery of the opening area DTA. The plurality of data lines DL may include a driving voltage line and a driving low voltage line according to signals. In some embodiments, the plurality of scan lines SL and the plurality of data lines DL may be changed.

Figure 5A:
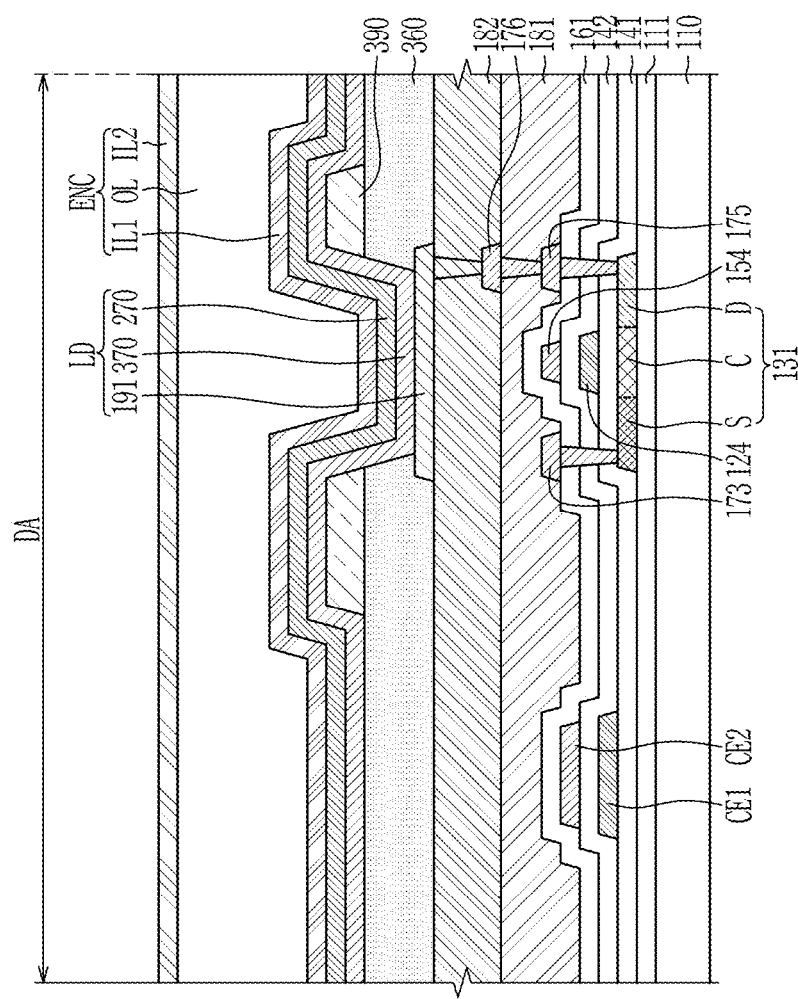
FIG. 5A illustrates a cross-sectional view of a display panel corresponding to a display area.
Figure 5B:
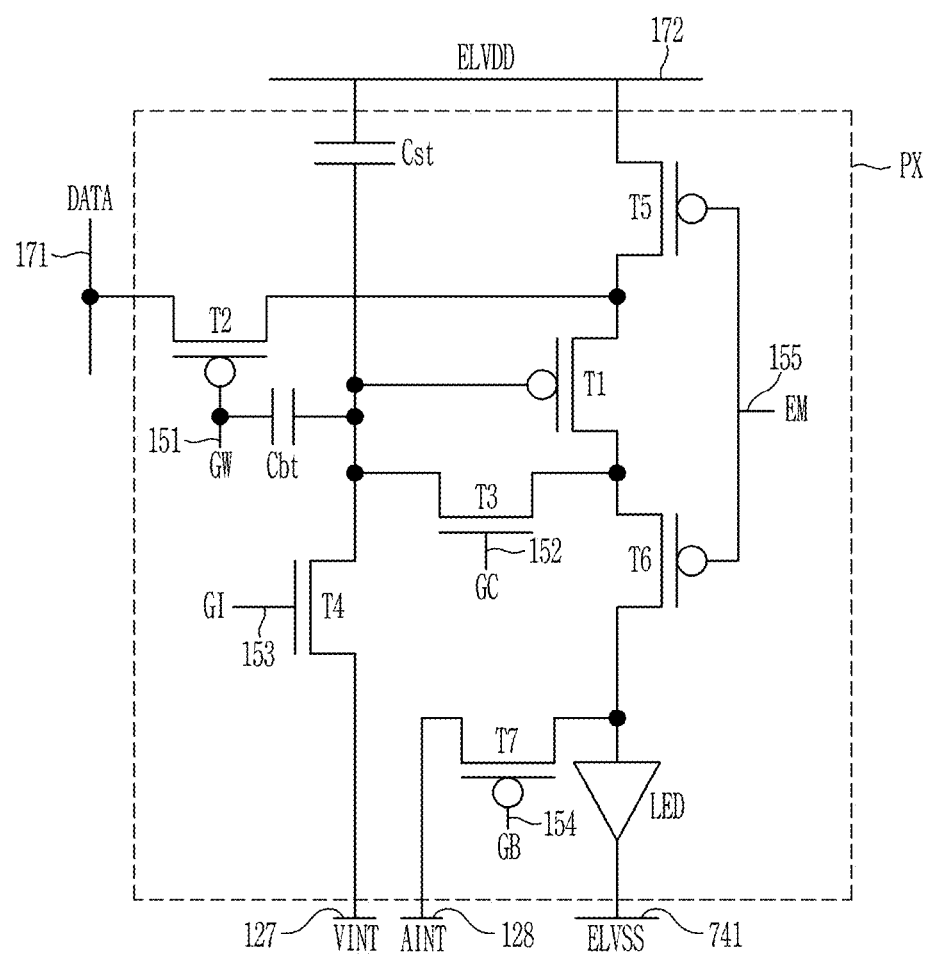
FIG. 5B illustrates a circuit diagram of a display device according to some embodiments.
Figure 5C:
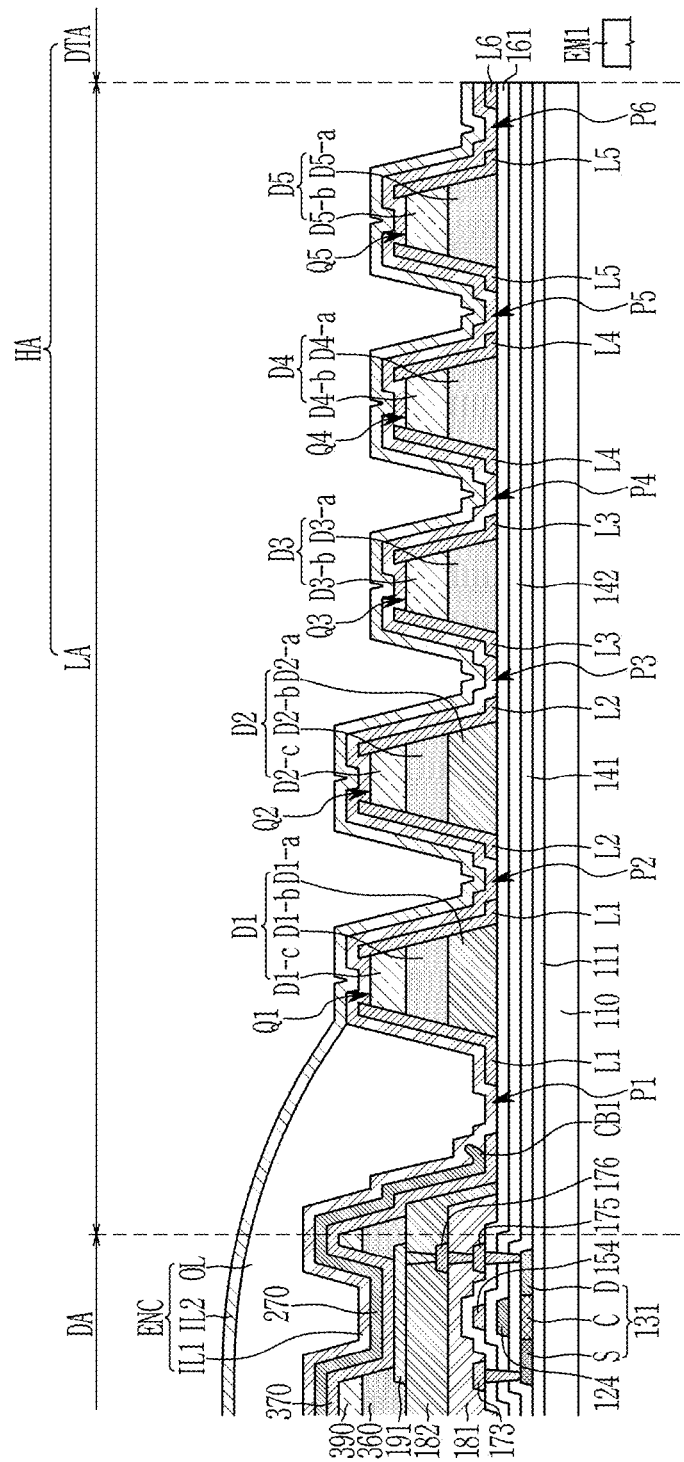
FIG. 5C illustrates a cross-sectional view of a display panel in which a peripheral area and an opening area are located according to some embodiments.

Hereinafter, an area surrounding the opening area DTA will be described with reference to FIG. 5A to FIG. 5C. FIG. 5A illustrates a cross-sectional view of a display panel corresponding to a display area, FIG. 5B illustrates a circuit diagram of a display device according to some embodiments, and FIG. 5C illustrates a cross-sectional view of a display panel in which a peripheral area and an opening area are located.

First of all, referring to FIG. 5A, the display area DA will be described as a reference.

The substrate 110 according to some embodiments may include an inorganic insulating material such as glass or an organic insulating material such as plastic such as polyimide (PI). The substrate 110 may have various degrees of flexibility. The substrate 110 may be a rigid substrate, or a flexible substrate that is bendable, foldable, or rollable. The buffer layer 111 may be single-layered or multi-layered. The substrate 110 may be one in which at least one base layer and at least one inorganic layer, which include polymer resins sequentially stacked, are alternately stacked.

A buffer layer 111 may be located on the substrate 110. The buffer layer 111 may block impurities from being transmitted from the substrate 110 to an upper layer of the buffer layer 111, particularly to a semiconductor layer 131, thereby preventing or reducing characteristic degradation of the semiconductor layer 131 and relatively reducing stress. The buffer layer 111 may include an inorganic insulating material such as a silicon nitride or a silicon oxide, or an organic insulating material. A portion or all of the buffer layer 111 may be omitted.

The semiconductor layer 131 is located on the buffer layer 111. The semiconductor layer 131 may include at least one of polysilicon or an oxide semiconductor. The semiconductor layer 131 includes a channel region (C), a first region (S), and a second region (D). The first region (S) and the second region (D) are located at respective sides of the channel region (C), respectively. The channel region (C) may include a semiconductor in which a small amount of impurities is doped compared to the first region (S) and the second region (D) or impurities are not doped, and the first region (S) and the second region (D) may include a semiconductor doped with a high concentration of conductive impurities. The semiconductor layer 131 may be formed of an oxide semiconductor, and in this case, a separate passivation layer may be added to protect an oxide semiconductor material that is vulnerable to external environments such as high temperature.

A first inorganic insulation layer 141 is located on the semiconductor layer 131. The first inorganic insulation layer 141 may be a single layer or multilayer including at least one of a silicon oxide ($SiO_x$), a silicon nitride ($SiN_x$), or a silicon oxynitride ($SiO_xN_y$).

A gate electrode 124 and a first capacitor electrode CE1 are located on the first inorganic insulation layer 141, and the gate electrode 124 and the first capacitor electrode CE1 may be a single film or multi-film in which a metal film including one of copper (Cu), a copper alloy, aluminum (Al), an aluminum alloy, molybdenum (Mo), and a molybdenum alloy is stacked. The gate electrode 124 may overlap the channel region (C) of the semiconductor layer 131.

A second inorganic insulation layer 142 is located on the gate electrode 124 and the first inorganic insulation layer 141. The second inorganic insulation layer 142 may be a single layer or multilayer including at least one of a silicon oxide ($SiO_x$), a silicon nitride ($SiN_x$), or a silicon oxynitride ($SiO_xN_y$).

An upper electrode 154 and a second capacitor electrode CE2 are located on the second inorganic insulation layer 142. The second capacitor electrode CE2 and the upper electrode 154 may be different portions of one conductive pattern. The second capacitor electrode CE2 and the upper electrode 154 may be electrically connected to each other.

The second capacitor electrode CE2 and the upper electrode 154 may be a single film or multi-film in which a metal film including one of copper (Cu), a copper alloy, aluminum (Al), an aluminum alloy, molybdenum (Mo), and a molybdenum alloy is stacked.

A third inorganic insulation layer 161 is located on the upper electrode 154 and the second capacitor electrode CE2. The third inorganic insulation layer 161 may be a single layer or multilayer including at least one of a silicon oxide ($SiO_x$), a silicon nitride ($SiN_x$), or a silicon oxynitride ($SiO_xN_y$).

A source electrode 173 and a drain electrode 175 are located on the third inorganic insulation layer 161. The source electrode 173 and the drain electrode 175 are respectively connected to the first region (S) and the second region (D) of the semiconductor layer 131 through contact holes formed in the third inorganic insulation layer 161 and the first and second inorganic insulation layers 141 and 142.

The source electrode 173 and the drain electrode 175 may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and they may have a single-layered or multi-layered structure including the same.

A first insulation layer 181 and a second insulation layer 182 are sequentially located on the third inorganic insulation layer 161, the source electrode 173, and drain electrode 175. The first insulation layer 181 and the second insulation layer 182 may include an organic insulating material such as a general purpose polymer such as polymethylmethacrylate (PMMA) or polystyrene (PS), a polymer derivative having a phenolic group, a acryl-based polymer, an imide-based polymer, a polyimide, an acryl-based polymer, and a siloxane-based polymer.

A connection member 176 may be located between the first insulation layer 181 and the second insulation layer 182. The connection member 176 may connect the drain electrode 175 and a first electrode 191. However, embodiments according to the present invention are not limited thereto, and the drain electrode and the first electrode may be directly connected without the connection member according to embodiments.

The first electrode 191 is located on the second insulation layer 182. The first electrode 191 is connected to the connection member 176 through a contact hole of the second insulation layer 182, and is electrically connected to the drain electrode 175.

The first electrode 191 may contain a metal such as silver (Ag), lithium (Li), calcium (Ca), aluminum (Al), magnesium (Mg), or gold (Au), and may also contain a transparent conductive oxide (TCO) such as an indium tin oxide (ITO) or an indium zinc oxide (IZO). The first electrode 191 may be formed of a single layer including a metal material or a transparent conductive oxide, or a multilayer including them. For example, the first electrode 191 may have a triple-layered structure of indium tin oxide (ITO)/silver (Ag)/indium tin oxide (ITO).

A transistor configured of the gate electrode 124, the semiconductor layer 131, the source electrode 173, and the drain electrode 175 is connected to the first electrode 191 to supply a current to a light emitting element LD.

A pixel definition layer 360 and a spacer 390 are located on the second insulation layer 182 and the first electrode 191.

The pixel definition layer 360 overlaps at least a portion of the first electrode 191 and has an opening defining a light emitting area. The opening may have a planar shape substantially similar to that of the first electrode 191. The opening may have a rhombus or an octagonal shape similar to a rhombus in a plan view, but is not limited thereto, and may have various shapes such as a quadrangle, a polygon, a circle, or an ellipse.

The pixel definition layer 360 and the spacer 390 may include an organic insulating material such as a general purpose polymer such as polymethylmethacrylate (PMMA) or polystyrene (PS), a polymer derivative having a phenolic group, a acryl-based polymer, an imide-based polymer, a polyimide, an acryl-based polymer, and a siloxane-based polymer.

An intermediate layer 370 is located on the first electrode 191 overlapping the opening. The intermediate layer 370 may include a light emitting layer and a functional layer.

The intermediate layer 370 may generate a colored light (e.g., a set or predetermined colored light). In the present specification, it is shown that the intermediate layer 370 is located in the display area DA and the peripheral area LA, but at least some of the intermediate layer 370 may be located only in the display area DA and not in the peripheral area LA. For example, the light emitting layer may be formed to be located only within an opening of the pixel definition layer 360 by using a mask. In this case, the light emitting layer is located in the display area DA and not in the peripheral area LA. The functional layer may be located in the display area DA and the peripheral area LA.

The light emitting layer may include an organic material and/or an inorganic material. In addition, the functional layer may include at least one of a hole injection layer (HIL), a hole transporting layer (HTL), an electron transporting layer (ETL), or an electron injection layer (EIL). The functional layer may be located between the first electrode 191 and the light emitting layer, or between the light emitting layer and the second electrode 270. The functional layer may have a shape overlapping an entire surface of the substrate 110. The functional layer may be entirely located on the plurality of pixels.

In the present specification, it is shown that the intermediate layer 370 overlaps the entire surface of the substrate 110, which shows embodiments in which the functional layer overlaps the entire surface of the substrate 110.

According to some embodiments, the light emitting layer may be formed only inside the pixel definition layer 360.

The second electrode 270 is located on the intermediate layer 370. The second electrode 270 may include a reflective metal including calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), or calcium (Ca), or a transparent conductive oxide (TCO) such as an indium tin oxide (ITO) or an indium zinc oxide (IZO).

The first electrode 191, the intermediate layer 370, and the second electrode 270 may form the light emitting element LD. Here, the first electrode 191 may be an anode, which is a hole injection electrode, and the second electrode 270 may be a cathode, which is an electron injection electrode. However, the embodiments are not necessarily limited thereto, and the first electrode 191 may be a cathode and the second electrode 270 may be an anode, according to a driving method of the light emitting display device.

Holes and electrons are injected into the organic intermediate layer 370 from the first electrode 191 and the second electrode 270, respectively, and light is emitted when excitons in which the injected holes and electrons are combined enter a ground state from an excited state.

An encapsulation layer ENC is located on the second electrode 270. The encapsulation layer ENC may cover and seal not only an upper surface but also a side surface of the light emitting element LD. Because the light emitting element is very vulnerable to moisture and oxygen, the encapsulation layer ENC seals the light emitting element LD to block inflow of moisture and oxygen from the outside.

The encapsulation layer ENC may include a plurality of layers, and in this case, it may be formed as a composite film including both an encapsulation inorganic layer and an encapsulation organic layer, and for example, it may be formed as a triple layer in which a first encapsulation inorganic layer IL1, an encapsulation organic layer OL, and a second encapsulation inorganic layer IL2 are sequentially formed.

The first encapsulation inorganic layer IL1 may cover the second electrode 270. The first encapsulation inorganic layer IL1 may prevent or reduce instances of external moisture, oxygen, or other contaminants from penetrating into the light emitting element LD. For example, the first encapsulation inorganic layer IL1 may include a silicon nitride, a silicon oxide, or a combination thereof. The first encapsulation inorganic layer IL1 may be formed through a deposition process.

The encapsulation organic layer OL may be located on the first encapsulation inorganic layer IL1 to contact the first encapsulation inorganic layer IL1. Curved portions formed on an upper surface of the first encapsulation inorganic layer IL1 or particles of being present on the first encapsulation inorganic layer IL1 are covered by the encapsulation organic layer OL, so that influence on constituent elements formed on the encapsulation organic layer OL by the surface state of the upper surface of the first encapsulation inorganic layer IL1 may be blocked. In addition, the encapsulation organic layer OL may reduce stress between layers in contact with each other. The encapsulation organic layer OL may include an organic material, and may be formed through a solution process such as a spin coating, slit coating, or inkjet process.

The second encapsulation inorganic layer IL2 is located on the encapsulation organic layer OL to cover the encapsulation organic layer OL. The second encapsulation inorganic layer IL2 may be stably formed on a relatively flat surface compared to the first encapsulation inorganic layer IL1. The second encapsulation inorganic layer IL2 encapsulates moisture discharged from the encapsulation organic layer OL to prevent or reduce inflow from the outside. The second encapsulation inorganic layer IL2 may include a silicon nitride, a silicon oxide, or a combination thereof. The second encapsulation inorganic layer IL2 may be formed through a deposition process.

According to some embodiments, a capping layer located between the second electrode 270 and the encapsulation layer ENC may be further included. The capping layer may include an organic material. The capping layer protects the second electrode 270 from a subsequent process, for example, a sputtering process, and improves light emitting efficiency of the light emitting element LD. The capping layer may have a refractive index larger than that of the first encapsulation inorganic layer IL1.

Although one of the transistors included in one pixel has been described above, each pixel may include a plurality of transistors. Hereinafter, an example of a plurality of transistors included in each pixel will be described with reference to FIG. 5B.

As shown in FIG. 5B, one pixel PX of the display device according to some embodiments includes transistors T1, T2, T3, T4, T5, T6, and T7), a storage capacitor Cst, a boost capacitor Cbt, and a light emitting diode LED, connected to a plurality of wires 127, 128, 151, 152, 153, 154, 155, 171, 172, and 741.

The plurality of wires 127, 128, 151, 152, 153, 154, 155, 171, 172, and 741 are connected to one pixel PX. The plurality of wires includes a first initialization voltage line 127, a second initialization voltage line 128, a first scan signal line 151, a second scan signal line 152, an initialization control line 153, a bypass control line 154, a light emitting control line 155, a data line 171, a driving voltage line 172, and a common voltage line 741.

The first scan signal line 151 is connected to a gate driver to transmit a first scan signal GW to the second transistor T2. The second scan signal line 152 may be applied with a voltage of an opposite polarity to a voltage applied to the first scan signal line 151 at the same timing as that of a signal of the first scan signal line 151. For example, when a negative voltage is applied to the first scan signal line 151, a positive voltage may be applied to the second scan signal line 152. The second scan signal line 152 transmits a second scan signal GC to the third transistor T3.

The initialization control line 153 transmits an initialization control signal GI to the fourth transistor T4. The bypass control line 154 transmits a bypass signal GB to the seventh transistor T7. The bypass control line 154 may include the previous first scan signal line 151. The light emitting control line 155 transmits a light emitting control signal EM to the fifth transistor T5 and the sixth transistor T6.

The data line 171 is a wire that transmits a data voltage DATA generated by a data driver, and luminance emitted by the light emitting diode LED is changed according to the data voltage DATA applied to the pixel PX.

The driving voltage line 172 applies the driving voltage ELVDD. The first initialization voltage line 127 transmits a first initialization voltage VINT, and the second initialization voltage line 128 transmits a second initialization voltage AINT. The common voltage line 741 applies the common voltage ELVSS to a cathode electrode of the light emitting diode LED. According to some embodiments, each of voltages applied to the driving voltage line 172, the first and second initialization voltage lines 127 and 128, and the common voltage line 741 may be a constant voltage.

The plurality of transistors may include a driving transistor T1, a second transistor T2, a third transistor T3, a fourth transistor T4, a fifth transistor T5, a sixth transistor T6, and a seventh transistor T7. The plurality of transistors may include an oxide transistor including an oxide semiconductor and a silicon transistor including a polycrystalline silicon semiconductor. For example, the third transistor T3 and the fourth transistor T4 may be formed as oxide transistors, and the driving transistor T1, the second transistor T2, the fifth transistor T5, the sixth transistor T6, and the seventh transistor T7 may be formed as silicon transistors. However, embodiments according to the present invention are not limited thereto, and the plurality of transistors may all be formed as silicon transistors.

In the above, it has been described that one pixel includes seven transistors T1 to T7, one storage capacitor Cst, and on one boost capacitor Cbt, but embodiments according to the present invention are not limited thereto, and the number of transistors, the number of capacitors, and their connection relationship may be variously changed.

Hereinafter, the hole area HA including the opening area DTA and the peripheral area LA of the opening area DTA will be described with reference to FIG. 5C. A description of the same constituent element as that described above will be omitted.

First, the buffer layer 111, the first inorganic insulation layer 141, the second inorganic insulation layer 142, and the third inorganic insulation layer 161 located on the substrate 110 may be located in the peripheral area LA. The buffer layer 111, the first inorganic insulation layer 141, the second inorganic insulation layer 142, and the third inorganic insulation layer 161 may have a shape extending from the display area DA. In the present specification, embodiments in which the buffer layer 111, the first inorganic insulation layer 141, the second inorganic insulation layer 142, and the third inorganic insulation layer 161 are all extended up to the peripheral area LA are shown, but in some embodiments, at least one of the buffer layer 111, the first inorganic insulation layer 141, the second inorganic insulation layer 142, or the third inorganic insulation layer 161 may be omitted.

A first dam D1 and a second dam D2 may be arranged in the order adjacent to the display area DA. The first dam D1 and the second dam D2 may be located in the peripheral area LA, and may be located on the third inorganic insulation layer 161.

The first dam D1 may include a (1-1)-th sub-dam D1-$a$, a (1-2)-th sub-dam D1-$b$, and a (1-3)-th sub-dam D1-$c$. The (1-1)-th sub-dam D1-$a$ may be manufactured in the same process with the same material as the second insulation layer 182 located in the display area DA. The (1-2)-th sub-dam D1-$b$ may be manufactured in the same process with the same material as the pixel definition layer 360 located in the display area DA. The (1-3)-th dam D1-$c$ may be manufactured in the same process with the same material as the spacer 390. The first dam D1 may control spreading of the encapsulation organic layer OL included in the encapsulation layer ENC during the manufacturing process.

The second dam D2 may include a (2-1)-th sub-dam D2-$a$, a (2-2)-th sub-dam D2-$b$, and a (3-3)-th sub-dam D2-$c$. The (2-1)-th sub-dam D2-$a$ may be manufactured in the same process with the same material as the second insulation layer 182 located in the display area DA. The (2-2)-th sub-dam D2-$b$ may be manufactured in the same process with the same material as the pixel definition layer 360 located in the display area DA. The (2-3)-th sub-dam D2-$c$ may be manufactured in the same process with the same material as the spacer 390 located in the display area DA. The second dam D2 may have a shape substantially equivalent to the first dam D1.

The peripheral area LA according to some embodiments may further include a third dam D3 to a fifth dam D5.

The third dam D3 may include a (3-1)-th sub-dam D3-$a$ and a (3-2) sub-dam D3-$b$. The (3-1)-th sub-dam D3-$a$ may be manufactured in the same process with the same material as the pixel definition layer 360 located in the display area DA. The (3-2)-th sub-dam D3-$b$ may be manufactured in the same process with the same material as the spacer 390 located in the display area DA.

The third dam D4 may include a (4-1)-th sub-dam D4-$a$ and a (4-2) sub-dam D4-$b$. The (4-1)-th sub-dam D4-$a$ may be manufactured in the same process with the same material as the pixel definition layer 360 located in the display area DA. The (4-2)-th sub-dam D4-$b$ may be manufactured in the same process with the same material as the spacer 390 located in the display area DA.

The fifth dam D5 may include a (5-1)-th sub-dam D5-$a$ and a (5-2) sub-dam D5-$b$. The (5-1)-th sub-dam D5-$a$ may be manufactured in the same process with the same material as the pixel definition layer 360 located in the display area DA. The (5-2)-th sub-dam D5-$b$ may be manufactured in the same process with the same material as the spacer 390 located in the display area DA.

The shapes of the third dam D3 to the fifth dam D5 may be the same. The present specification shows the embodiments including the first and second dams D1 and D2 and the third to fifth dams D5 having the same height. However, embodiments according to the present invention are not limited thereto, and some embodiments may include one of the first and second dams D1 and D2 and at least one of the third to fifth dams D3, D4, or D5. In addition, the arrangement order of the first to fifth dams D1 to D5 may be changed. In some embodiments, the shape, number, and arrangement of the dams may be variously changed.

Meanwhile, the dam shown in the present specification may have a ring shape surrounding the opening area DTA in a plan view as shown in FIG. 4. However, this is an shape, and the first to fifth dams D1 to D5 may have a shape different from the opening area DTA. For example, the first to fifth dams D1 to D5 may have a closed line shape including a polygon, an ellipse, or at least partial curved line, or may be provided in a shape including a plurality of patterns that are partially disconnected, but are not limited to any one embodiment.

The intermediate layer 370 and the second electrode 270 extending from the display area DA to at least a portion of the peripheral area LA may be located in the peripheral area LA. Ends of the intermediate layer 370 and the second electrode 270 may overlap the peripheral area LA.

The end of the second electrode 270 may be rolled up along the third direction DR3. The end of the second electrode 270 may include a burr CB1. Except for a portion of the second electrode 270 extending from the display area DA to the peripheral area LA, a layer located on the same layer as the second electrode may be removed in the peripheral area LA.

First layers L1, L2, L3, L4, L5, and L6 may be located in the peripheral area LA. The first layers L1, L2, L3, L4, L5, and L6 includes the same material as the intermediate layer 370, and may be formed in the same process. According to some embodiments, some L6 of the first layers may extend up to the end of the peripheral area LA, and may form an inner surface of the opening area DTA.

A plurality of first layers L1, L2, L3, L4, L5, and L6 may be located in the peripheral area LA according to some embodiments. The first layers L1, L2, L3, L4, L5, and L6 may include a (1-1)-th layer L1, a (1-2)-th layer L2, a (1-3)-th layer L3, a (1-4)-th layer L4, a (1-5)-th layers L5, and a (1-6)-th layer L6, in the order of being adjacent to the display area DA. The plurality of first layers L1, L2, L3, L4, L5, and L6 may be spaced apart from each other. As described above, according to some embodiments, the (1-6)-th layer L6, which is one of the first layers, may extend up to the end of the peripheral area LA, and may form the inner surface of the opening area DTA. However, embodiments according to the present invention are not limited thereto, and in some embodiments, the (1-6)-th layer L6 may be omitted.

The first layers L1, L2, L3, L4, and L5 may overlap the dams D1, D2, D3, D4, and D5. The (1-1)-th layer L1 may overlap the first dam D1, particularly may overlap a side surface of the first dam D1. The (1-2)-th layer L2 may overlap the second dam D2, particularly may overlap a side surface of the second dam D2. The (1-3)-th layer L3 may overlap the third dam D3, particularly may overlap a side surface of the third dam D3. The (1-4)-th layer L4 may overlap the fourth dam D4, particularly may overlap a side surface of the fourth dam D4. The (1-5)-th layer L5 may overlap the fifth dam D5, particularly may overlap a side surface of the fifth dam D5.

The first layers L1, L2, L3, L4, and L5 may include first areas Q1, Q2, Q3, Q4, and Q5 exposing upper surfaces of the dams D1, D2, D3, D4, and D5. The first areas Q1, Q2, Q3, Q4, and Q5 overlap the upper surfaces of the dams D1, D2, D3, D4, and D5, and may be spaced apart from the intermediate layer or first layer and the second electrode. The (1-1)-th layer L1 may include a (1-1)-th area Q1 exposing the upper surface of the first dam D1. The (1-2)-th layer L2 may include a (1-2)-th area Q2 exposing the upper surface of the second dam D2. The (1-3)-th layer L3 may include a (1-3)-th area Q3 exposing the upper surface of the third dam D3. The (1-4)-th layer L4 may include a (1-4)-th area Q4 exposing the upper surface of the fourth dam D4. The (1-5)-th layer L5 may include a (1-5)-th area Q5 exposing the upper surface of the fifth dam D5.

Because the first layers L1, L2, L3, L4, and L5 do not respectively overlap the upper surfaces of the dams D1, D2, D3, D4, and D5, they may be spaced apart from the upper surfaces of the dams D1, D2, D3, D4, and D5.

The ends of the first layers L1, L2, L3, L4, and L5 may further protrude than the upper surfaces of the dams D1, D2, D3, D4, and D5 in the first area Q1, Q2, Q3, Q4, and Q5. During the manufacturing process, only the first layers located on the upper surfaces of the dams may be removed, and the first layers extending from the side surfaces of the dams may remain.

The plurality of first layers L1, L2, L3, L4, L5, and L6 located in the peripheral area LA may be spaced apart from each other. The exposed area of the third inorganic insulation layer 161 between adjacent first layers L1, L2, L3, L4, L5, and L6 are second areas P1, P2, P3, P4, P5, and P6. For example, an area that is between the end of the intermediate layer 370 extending up to the peripheral area LA and the (1-1)-th layer L1 and in which the third inorganic insulation layer 161 is exposed is a (2-1)-th area P1. An area that is between the (1-1)-th layer L1 and the (1-2)-th layer L2 and in which the third inorganic insulation layer 161 is exposed is a (2-2)-th area P2. An area that is between the (1-2)-th layer L2 and the (1-3)-th layer L3 and in which the third inorganic insulation layer 161 is exposed is a (2-3)-th area P3. An area that is between the (1-3)-th layer L3 and the (1-4)-th layer L4 and in which the third inorganic insulation layer 161 is exposed is a (2-4)-th area P4. An area that is between the (1-4)-th layer L4 and the (1-5)-th layer L5 and in which the third inorganic insulation layer 161 is exposed is a (2-5)-th area P5. An area that is between the (1-5)-th layer L5 and the (1-6)-th layer L6 and in which the third inorganic insulation layer 161 is exposed is a (2-6)-th area P6.

The first encapsulation inorganic layer IL1 and the second encapsulation inorganic layer IL2 overlapping the upper surfaces of the dams D1, D2, D3, D4, and D5 may be located in the first areas Q1, Q2, Q3, Q4, and Q5. Particularly, the first encapsulation inorganic layer IL1 may have a shape that fills grooves formed by the first layers L1, L2, L3, L4, and L5 in the first areas Q1, Q2, Q3, Q4, and Q5, and accordingly it may have a stepped shape. The first encapsulation inorganic layer IL1 on the upper surfaces of the dams D1, D2, D3, D4, and D5 may have a shape located within the first areas Q1, Q2, Q3, Q4, and Q5. The first encapsulation inorganic layer IL1 may contact the upper surfaces of the dams D1, D2, D3, D4, and D5 in the first areas Q1, Q2, Q3, Q4, and Q5.

The first encapsulation inorganic layer IL1 and the second encapsulation inorganic layer IL2 located on the third inorganic insulation layer 161 may be located in the second areas P1, P2, P3, P4, P5, and P6. The first encapsulation inorganic layer IL1, the encapsulation organic layer OL, and the second encapsulation inorganic layer IL2 may be located in the (2-1)-th area P1 located between the display area DA and the first dam D1. The first encapsulation inorganic layer IL1 may contact the exposed third inorganic insulation layer 161 in the second areas P1, P2, P3, P4, P5, and P6. In addition, the first encapsulation inorganic layer IL1 may have a stepped shape while being located within the second areas P1, P2, P3, P4, P5, and P6.

A (1-6)-th layer L1-6 may be exposed to the outside by the opening area DTA. However, because the intermediate layer 370 or the first layers L1, L2, L3, L4, L5, and L6 made of the same material as the intermediate layer has a shape disconnected in the first areas Q1, Q2, Q3, Q4, and Q5 and the second areas P1, P2, P3, P4, P5, and P6, a moisture permeation path is blocked such that the moisture does not penetrate into the display area DA.

In the present specification, the structure in which the intermediate layer 370 and the second electrode 270 are removed from each of the upper surfaces of the plurality of dams D1, D2, D3, D4, and D5 is shown. However, embodiments according to the present invention are not limited thereto, and the same material layer as the intermediate layer and the same material layer as the second electrode may be removed from at least one of the plurality of dams D1, D2, D3, D4, or D5. Instances of moisture permeating into the display area DA may be prevented or reduced.

In the peripheral area LA excluding the first areas Q1, Q2, Q3, Q4, and Q5 and the second areas P1, P2, P3, P4, P5, and P6, the first layers L1, L2, L3, L4, L5, and L6 and the first encapsulation inorganic layer IL1 and the second encapsulation inorganic layer IL2 located thereon may be stacked.

The end of the second electrode 270 between the display area DA and the (2-1)-th area P1 may include the burr CB1. The first encapsulation inorganic layer IL1, the encapsulation organic layer OL, and the second encapsulation inorganic layer IL2 may be located between the display area DA and the (2-1)-th area P1. Even if the burr CB1 included in the second electrode 270 penetrates through the first encapsulation inorganic layer IL1, it is covered by the encapsulation organic layer OL, so it may be possible to prevent or reduce instances of cracks occurring or to prevent or reduce instances of moisture or foreign particles permeating.

The first electronic module EM1 may be inserted into the opening area DTA. An inner surface of the open area DTA may be defined by the ends of a substrate 100, the buffer layer 111, the first inorganic insulation layer 141, the second inorganic insulation layer 142, the third inorganic insulation layer 161, the (1-6)-th layer L6, the first encapsulation inorganic layer IL1, and the second encapsulation inorganic layer IL2. The ends of a substrate 100, the buffer layer 111, the first inorganic insulation layer 141, the second inorganic insulation layer 142, the third inorganic insulation layer 161, the (1-6)-th layer L6, the first encapsulation inorganic layer IL1, and the second encapsulation inorganic layer IL2 may be aligned with each other to form the opening area DTA. In some embodiments, at least one of the buffer layer 111, the first inorganic insulation layer 141, the second inorganic insulation layer 142, or the third inorganic insulation layer 161 may be omitted. In addition, according to some embodiments, a portion of the first layer, that is, the (1-6)-th layer L6, may be omitted.

According to some embodiments, the area in which the intermediate layer is disconnected may be located on the third inorganic insulation layer 161 as well as on the dams D1, D2, D3, D4, and D5. When the area in which the intermediate layer is disconnected is located only on the third inorganic insulation layer 161 along with the second areas P1, P2, P3, P4, P5, and P6, the first areas Q1, Q2, Q3, Q4, and Q5 is located between the dam and the dam or between the dam and the opening area DTA in order to block a moisture permeation path. Accordingly, a distance between the dam and the dam increases, or a distance between the dam and the opening area DTA increases, so that an area occupied by the peripheral area LA increases. However, according to some embodiments, because the first area blocking the moisture permeation path is located on the dams D1, D2, D3, D4, and D5, it is possible to reduce an area of the peripheral area LA, that is, a dead space.

Hereinafter, a display panel according to a manufacturing process will be described with reference to FIG. 6 to FIG. 11. FIG. 6, FIG. 7, FIG. 8, FIG. 9, FIG. 10, and FIG. 11 respectively illustrate a cross-sectional view of a partial area of a display device according to a manufacturing process. The same reference numerals are used for the same constituent elements as those described above, so redundant descriptions will be omitted.

Figure 6:
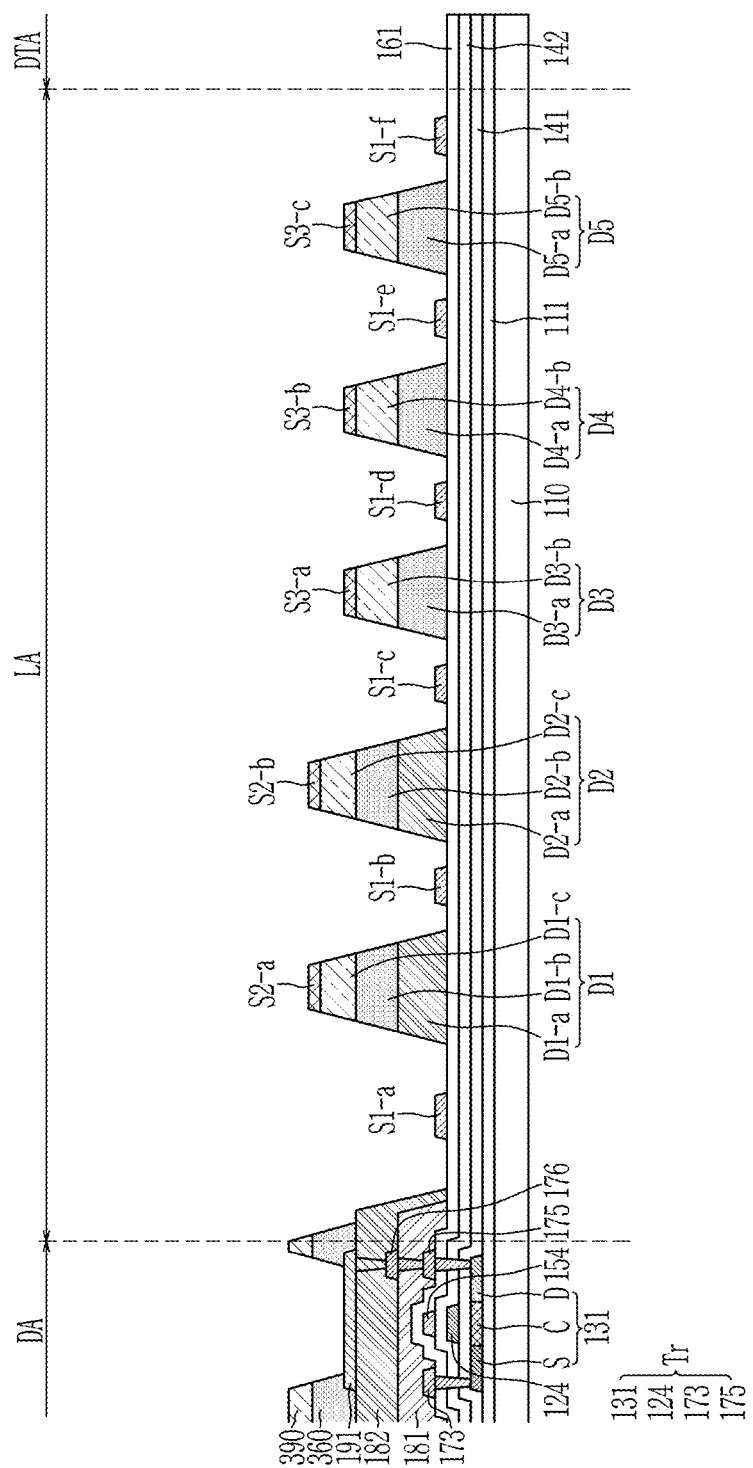
FIG. 6, FIG. 7, FIG. 8, FIG. 9, FIG. 10, and FIG. 11 respectively illustrate a cross-sectional view of a partial area of a display panel as part of a manufacturing process according to some embodiments.

First, as shown in FIG. 6, in the display device according to some embodiments, a transistor Tr overlapping the display area DA and located on the substrate 110, and the first electrode 191 connected to the transistor Tr are formed. The transistor Tr and the first electrode 191 may be formed by patterning a conductive material.

The pixel definition layer 360 and the spacer 390 may be formed on the first electrode 191. The pixel definition layer 360 may be formed to include an opening exposing at least a portion of the first electrode 191. At the same time, the first to fifth dams D1, D2, D3, D4, and D5 may be formed in the peripheral area LA. The first to fifth dams D1, D2, D3, D4, and D5 may be formed to have a multi-layered structure containing an organic material.

Then, a sacrificial layer is formed on the upper surfaces of the first to fifth dams D1, D2, D3, D4, and D5 and on a portion of the upper surface of the third inorganic insulation layer 161 overlapping the peripheral area LA. First sacrificial layers S1-a, S1-b, S1-c, S1-d, S1-e, and S1-f may be located on the upper surface of the third inorganic insulation layer 161; second sacrificial layers S2-a and S2-b may be located at the upper portions of the first dam D1 and the second dam D2; and third sacrificial layers S3-a, S3-b, and S3-c may be located at the upper portions of the third to fifth dams D3 to D5. Each of the first sacrificial layers S1-a, S1-b, S1-c, S1-d, S1-e, and S1-f), the second sacrificial layers S2-a and S2-b, and the third sacrificial layers S3-a, S3-b, and S3-c may include a metallic material, and for example, may include one of silver (Ag), titanium (Ti), and molybdenum (Mo).

Figure 7:
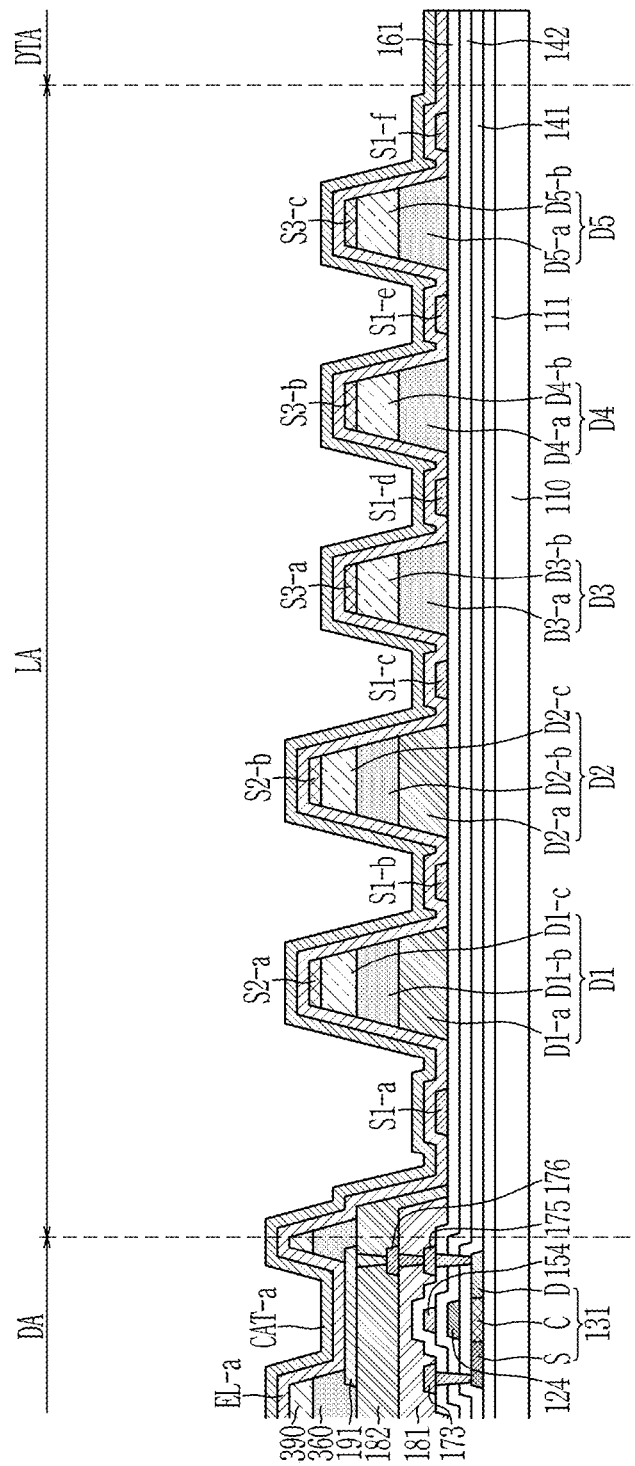

Next, as shown in FIG. 7, an intermediate material layer EL-a and a second electrode material layer CAT-a are formed by using a deposition process.

The intermediate material layer EL-a may include a light emitting layer formed to be located only in the opening of the pixel defining layer 360 by using a mask and a functional material layer formed to overlap the entire surface of the substrate 110. The functional layer may include a material layer for forming at least one of the hole injection layer (HIL), the hole transporting layer (HTL), the electron transporting layer (ETL), or the electron injection layer (EIL), which are described in more detail above.

Figure 8:
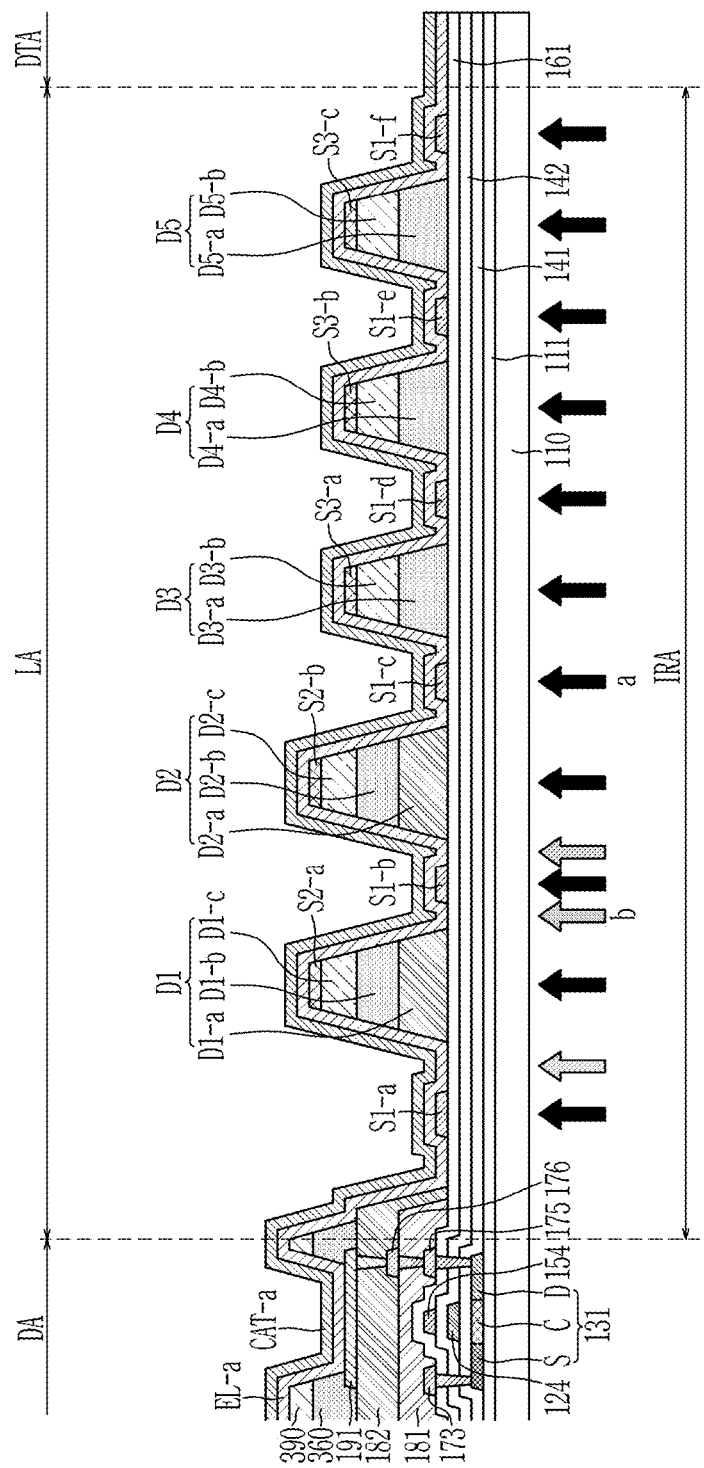

Meanwhile, according to some embodiments, the light emitting layer may be located only within the opening, and according to some embodiments, the intermediate material layer EL-a may overlap the entire surface of the substrate 110. FIG. 8 illustrates a structure in which the functional material layer overlaps the entire surface of the substrate 110 is shown, but embodiments according to the present disclosure are not limited thereto as described above.

Then, as shown in FIG. 8, the first sacrificial layers S1-a, S1-b, S1-c, S1-d, S1-e, and S1-f are separated from the third inorganic insulation layer 161 by irradiating a laser to a portion IRA of the peripheral area LA, and the second sacrificial layers S2-a and S2-b) and the third sacrificial layers S3-a, S3-b, and S3-c are separated from the dams D1, D2, D3, D4, and D5. Particularly, the first sacrificial layers S1-a, S1-b, S1-c, S1-d, S1-e, and S1-f, the second sacrificial layers S2-a and S2-b, and the third sacrificial layer S3-a, S3-b, and S3-c may be separated from the third inorganic insulation layer 161 or dams D1, D2, D3, D4, and D5 through laser ablation.

The intermediate material layer EL-a and the second electrode material layer CAT-a that are stacked on the first sacrificial layers S1-a, S1-b, S1-c, S1-d, S1-e, and S1-f, the second sacrificial layers S2-a and S2-b, and the third sacrificial layers S3-a, S3-b, and S3-c, may be removed. In addition, although the sacrificial layers S1, S2, and S3 are not located, the second electrode material layer CAT-a may be removed in an area to which a laser beam is irradiated.

According to some embodiments, laser beams having different energy densities (ED) may be irradiated to the laser beam irradiated area IRA. For example, a laser beam (a) having a high energy density may be irradiated to the area in which the first sacrificial layers S1-a, S1-b, S1-c, S1-d, S1-e, and S1-f, the second sacrificial layers S2-a and S2-b, and the third sacrificial layers S3-a, S3-b, and S3-c are located, and a laser beam (b) having a low energy density may be irradiated to the remaining area.

The energy density of the irradiated laser beam may be about 1000 mJ/cm$^2$ or less. This is to prevent or reduce carbonization of the insulation layer and pixel definition layer. In addition, a size of the irradiated laser beam and a gap between adjacent laser beams may be changed according to the design.

Meanwhile, the laser beam may be irradiated in a direction from the display area DA toward an area in which the opening area DTA is to be formed.

Figure 9:
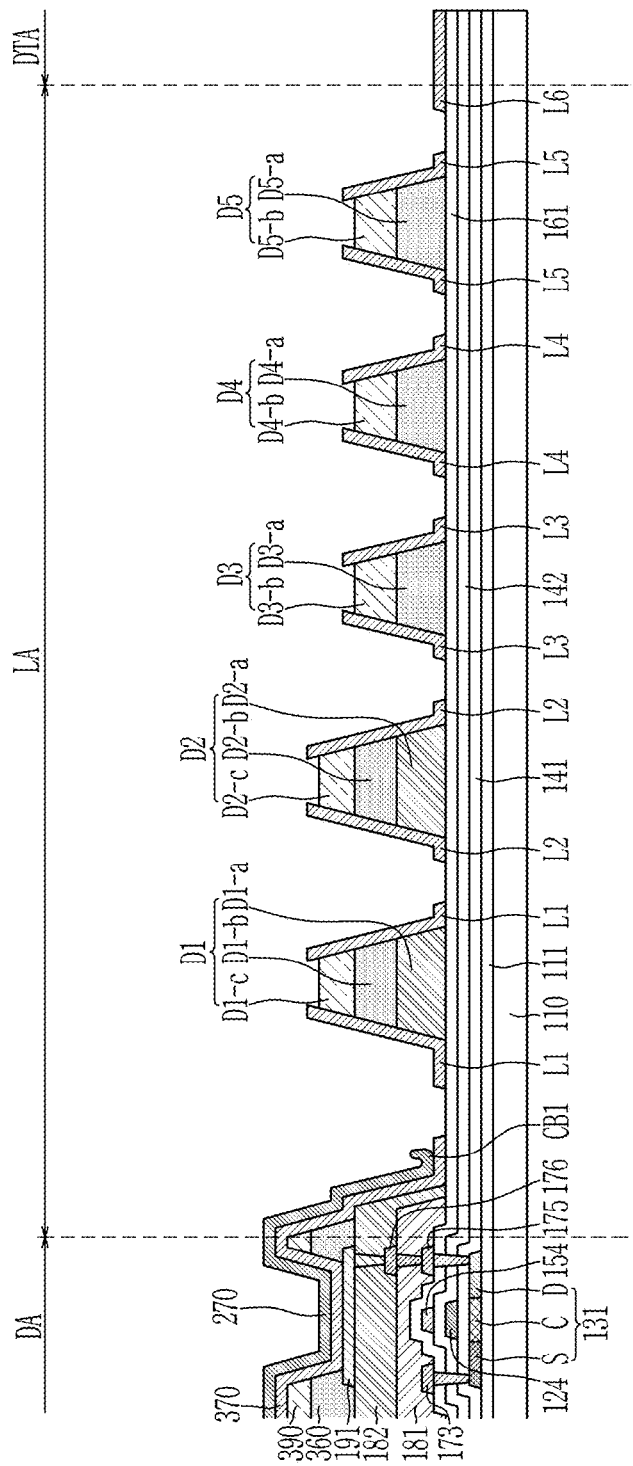

As shown in FIG. 9, the first layers L1, L2, L3, L4, L5, and L6 are formed in the peripheral area LA by removing the sacrificial layer. A light emitting element including the first electrode 191, the intermediate layer 370, and the second electrode 270 is formed in the display area DA. Except for the second electrode 270 that extends from the display area DA and overlaps a portion of the peripheral area LA, the second electrode material layer may be removed.

The first layers L1, L2, L3, L4, and L5 may overlap the side surfaces of the dams D1, D2, D3, D4, and D5. The first layers L1, L2, L3, L4, and L5 may expose the upper surfaces of the dams D1, D2, D3, D4, and D5. In addition, the first layers L1, L2, L3, L4, and L5 may include one ends further protruding than the upper surfaces of the dams D1, D2, D3, D4, and D5.

Figure 10:
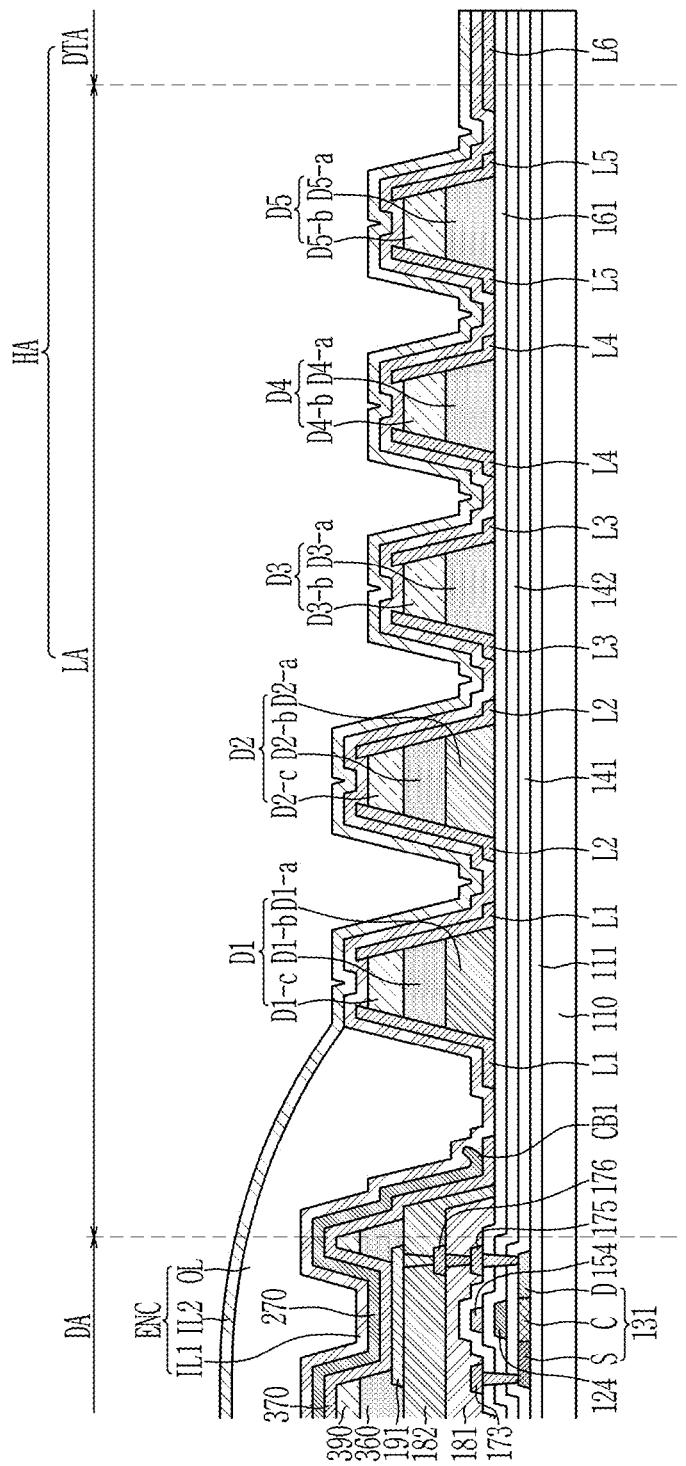

Thereafter, as shown in FIG. 10, the first encapsulation inorganic layer IL1 may be formed on the entire surface of the substrate 110. In addition, the encapsulation organic layer OL may be formed to be located in a portion of the peripheral area LA while overlapping the display area DA. In the process of forming the encapsulation organic layer OL, a liquid organic material may be prevented from spreading by the dam D1. The encapsulation organic layer OL may be formed by an inkjet method by which a liquid organic material is applied on the first encapsulation inorganic layer IL1. In this case, the dam D1 sets a boundary of an area in which the liquid organic material is applied, and prevent or reduce instances of the liquid organic material overflowing to the outside of the dam D1. Then, the second encapsulation inorganic layer IL2 may be formed on the encapsulation organic layer OL to overlap the entire surface of the substrate 110. The first encapsulation inorganic layer IL1 and the second encapsulation inorganic layer IL2 may contact each other in the peripheral area LA.

Figure 11:
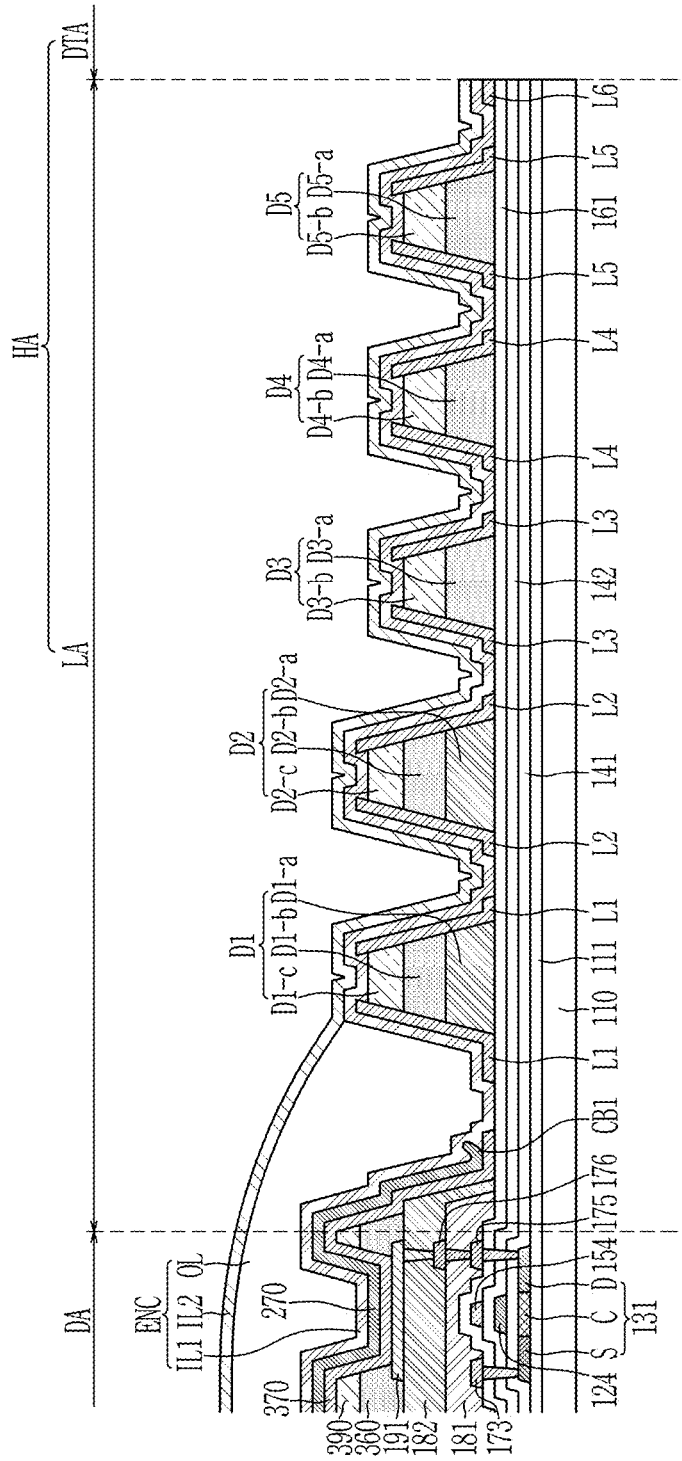

Subsequently, as shown in FIG. 11, the opening area DTA is formed. The opening area DTA may be formed to pass through the substrate. The opening area DTA may be formed by a laser or drilling process.

Then, the above-described first electronic module EM1 may be mounted in the opening area DTA. The opening area DTA may be formed as an inner surface in which an end of the substrate 110, an end of the buffer layer 111, ends of the first and second inorganic insulation layers 141 and 142, an end of the third inorganic insulation layer 161, an end of the first layer L6, an end of the first encapsulation inorganic layer IL1, and an end of the second encapsulation inorganic layer IL2 are aligned.

In the laser irradiation process or drilling process according to some embodiments, some particles may be introduced into the display panel. In this case, even if particles is introduced into the peripheral area LA, because the intermediate layer, which is the moisture permeation path, is disconnected on the upper surfaces of the dams D1, D2, D3, D4, and D5, the moisture permeation path may be blocked.

Figure 12:
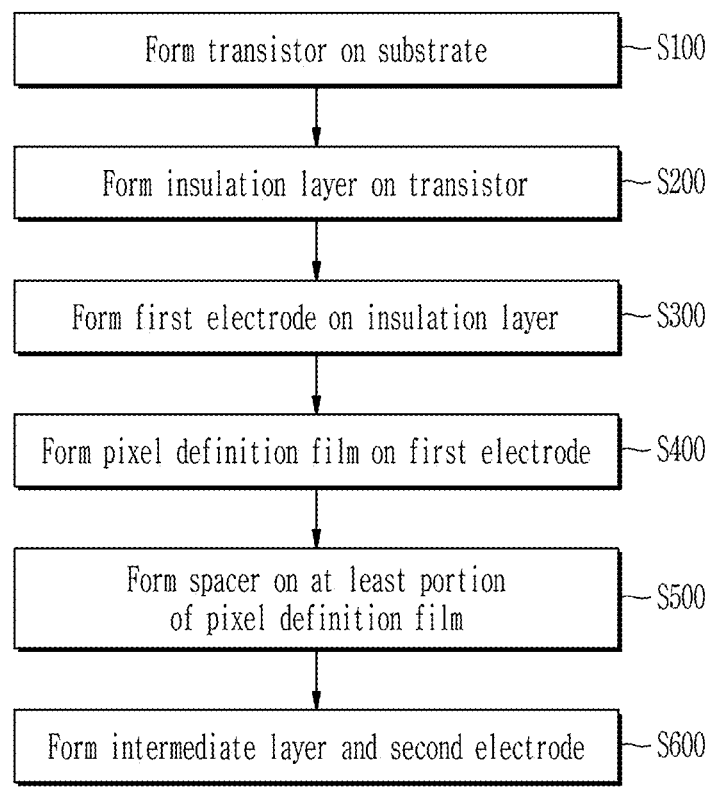
FIG. 12 illustrates a flowchart of a manufacturing process of a display panel according to some embodiments.

Hereinafter, a display panel according to some embodiments will be described with reference to FIG. 12, FIG. 13, FIG. 14, and FIG. 15. FIG. 12 illustrates a flowchart of a manufacturing process of a display panel according to some embodiments, and FIG. 13, FIG. 14, and FIG. 15 respectively illustrate a cross-sectional view of a partial area of a display panel according to some embodiments. A description of the same constituent element as that described above will be omitted.

When the manufacturing method of the display panel according to some embodiments is briefly described with reference to FIG. 12 along with the above-described drawings, first, the transistor Tr is formed on the substrate 110 (S100). The insulation layers 181 and 182 are formed on the transistor Tr (S200). Then, the first electrode 191 that is electrically connected to the transistor Tr is formed on the insulation layers 181 and 182 (S300). Subsequently, the pixel definition layer 360 is formed on the first electrode 191 (S400). The spacer 390 is formed on at least a portion of the pixel definition layer 360 (S500). Then, the intermediate layer 370 and the second electrode 270 are formed (S600).

Figure 13:
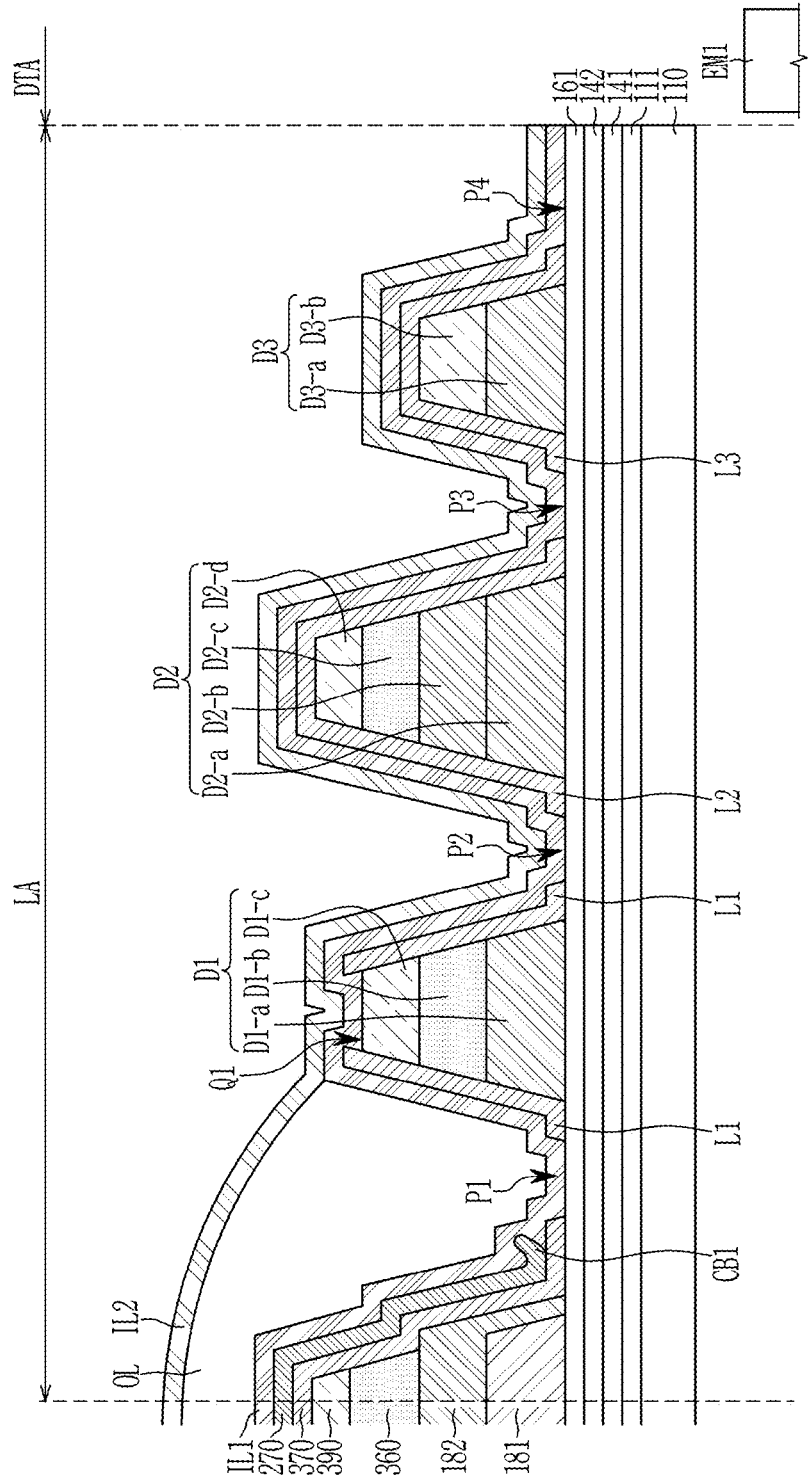
FIG. 13, FIG. 14, and FIG. 15 respectively illustrate a cross-sectional view of a partial area of a display panel according to some embodiments.

Referring to FIG. 13, the display panel according to some embodiments may include the first dam D1, the second dam D2, and the third dam D3.

The first dam D1 may include the (1-1)-th sub-dam D1-a, the (1-2)-th sub-dam D1-b, and the (1-3)-th sub-dam D1-c. The (1-1)-th sub-dam D1-a may be manufactured in the same process with the same material as the second insulation layer 182 located in the display area DA. The (1-2)-th sub-dam D1-b may be manufactured in the same process with the same material as the pixel definition layer 360 located in the display area DA. The (1-3)-th dam D1-c may be manufactured in the same process with the same material as the spacer 390. The first dam D1 may control spreading of the encapsulation organic layer OL included in the encapsulation layer ENC during the manufacturing process.

The second dam D2 may include the (2-1)-th sub-dam D2-a, the (2-2)-th sub-dam D2-b, the (2-3)-th sub-dam D2-c, and the (2-4)-th sub-dam D2-d. The (2-1)-th sub-dam D2-a may be manufactured in the same process with the same material as the first insulation layer 181 located in the display area DA. The (2-2)-th sub-dam D2-b may be manufactured in the same process with the same material as the second insulation layer 182 located in the display area DA. The (2-3)-th sub-dam D2-c may be manufactured in the same process with the same material as the pixel definition layer 360 located in the display area DA. The (2-4)-th sub-dam D2-d may be manufactured in the same process with the same material as the spacer 390 located in the display area DA.

The third dam D3 may include the (3-1)-th sub-dam D3-a and the (3-2) sub-dam D3-b. The (3-1)-th sub-dam D3-a may be manufactured in the same process with the same material as the pixel definition layer 360 located in the display area DA. The (3-2)-th sub-dam D3-b may be manufactured in the same process with the same material as the spacer 390 located in the display area DA.

Referring to FIG. 13, the first layers L1, L2, and L3 according to some embodiments may include the (1-1)-th layer L1, the (1-2)-th layer L2, and the (1-3)-th layer L3. Among the first to third dams D1, D2, and D3, the (1-1)-th layer L1 on the first dam D1 may include the first area Q1 exposing the upper surface of the first dam D1. The upper surface of the first dam D1 may be spaced apart from the (1-1)-th layer L1. The (1-2)-th layer L2 and the (1-3)-th layer L3 may overlap the upper surface of the second dam D2 and the upper surface of the third dam D3. In addition, the first layers L1, L2, and L3 may include the second areas P1, P2, P3, and P4 exposing the third inorganic insulation layer 161.

The inner surface of the open area DTA may be defined by the ends of a substrate 110, the buffer layer 111, the first inorganic insulation layer 141, the second inorganic insulation layer 142, the third inorganic insulation layer 161, the first encapsulation inorganic layer IL1, and the second encapsulation inorganic layer IL2. The ends of a substrate 100, the buffer layer 111, the first inorganic insulation layer 141, the second inorganic insulation layer 142, the third inorganic insulation layer 161, the first encapsulation inorganic layer IL1, and the second encapsulation inorganic layer IL2 may be aligned with each other to form the opening area DTA.

According to some embodiments, the dam located in the peripheral area LA may be changed to various shapes and arrangements. In addition, the first layers L1, L2, and L3 located in the peripheral area LA may have a shape spaced apart from an upper surface of at least one dam. In addition, the opening area DTA may not be exposed at an end of a layer formed of the intermediate material layer and the second electrode material layer.

Figure 14:
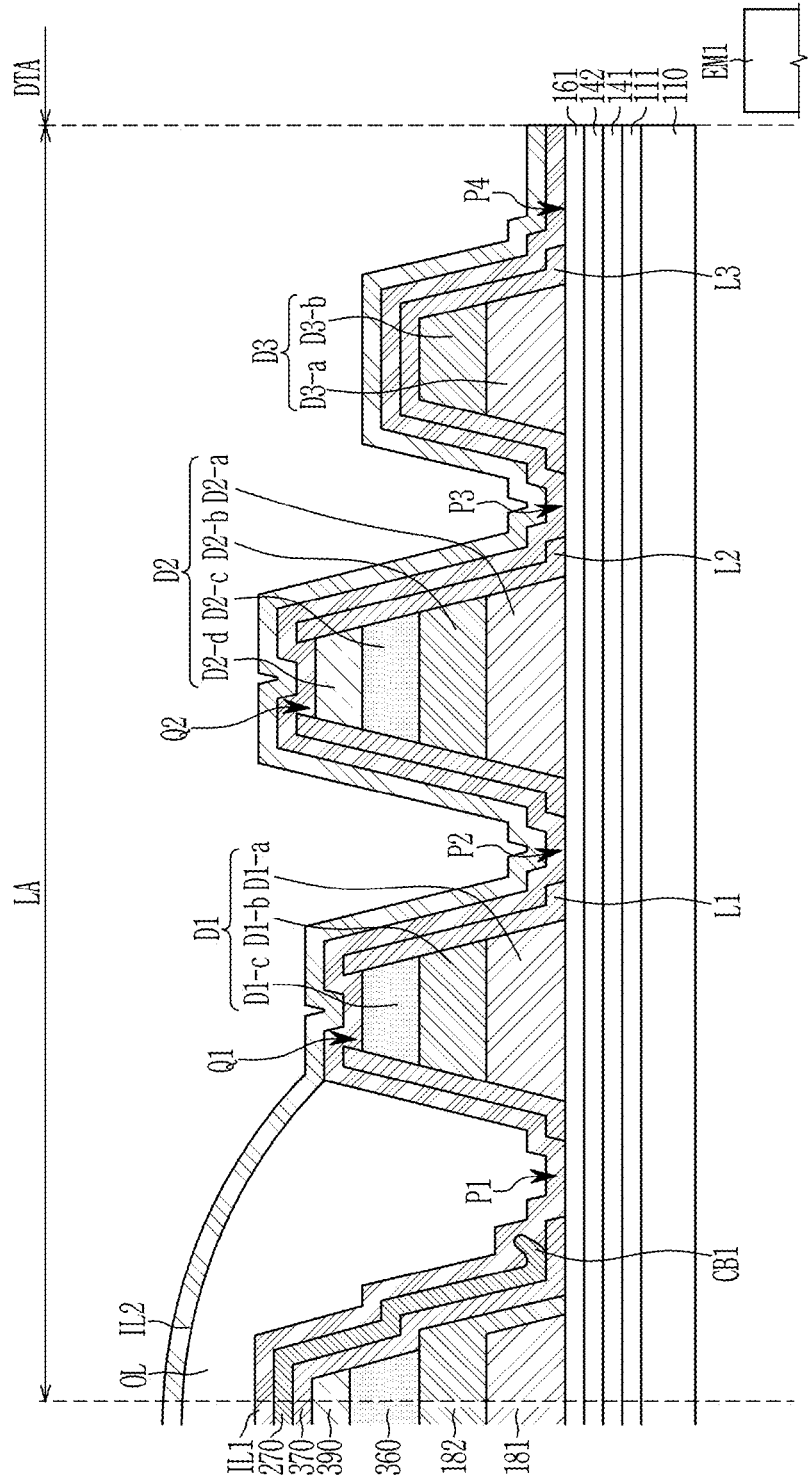

As shown in FIG. 14, the first layers L1, L2, and L3 according to some embodiments may include the (1-1)-th layer L1, the (1-2)-th layer L2, and the (1-3)-th layer L3. Among the first to third dams D1, D2, and D3, the (1-1)-th layer L1 on the first dam D1 may include the first area Q1 exposing the upper surface of the first dam D1. In addition, the (1-2)-th layer L2 on the second dam D2 may include the second area Q2 exposing the upper surface of the second dam D2. The upper surface of the first dam D1 may be spaced apart from the (1-1)-th layer L1. The upper surface of the second dam D2 may be spaced apart from the (1-2)-th layer L2. The (1-3)-th layer L3 may overlap the upper surface of the third dam D3. In addition, the first layers L1, L2, and L3 may include the second areas P1, P2, P3, and P4 exposing the third inorganic insulation layer 161.

According to some embodiments, the dam located in the peripheral area LA may be changed to various shapes and arrangements. In addition, the first layers L1, L2, and L3 located in the peripheral area LA may have a shape spaced apart from an upper surface of at least one dam. In addition, the opening area DTA may not be exposed at an end of a layer formed of the intermediate material layer and the second electrode material layer.

Figure 15:
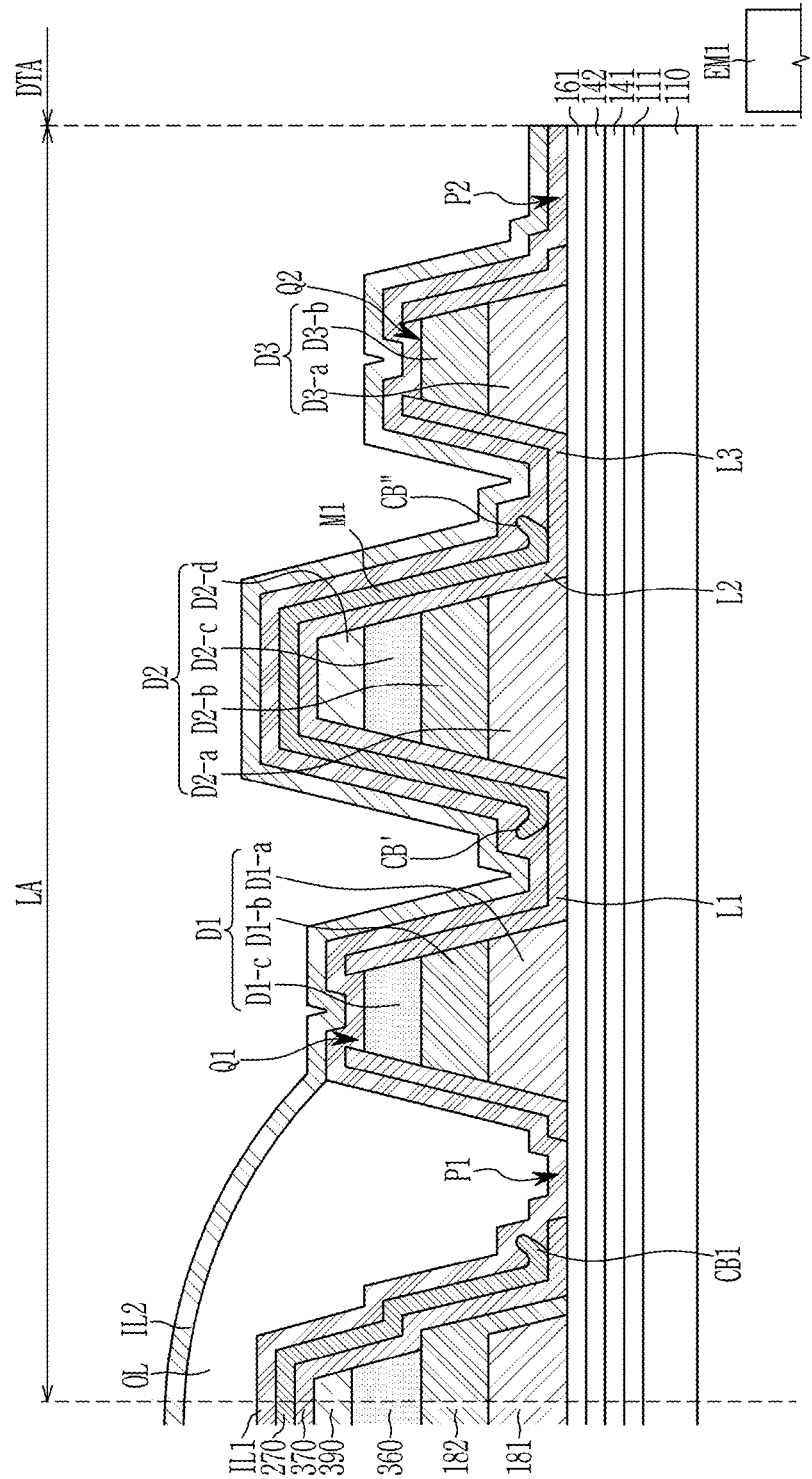

Meanwhile, referring to FIG. 15, the first layers L1, L2, and L3 according to some embodiments may include the (1-1)-th layer L1, the (1-2)-th layer L2, and the (1-3)-th layer L3. Among the first to third dams D1, D2, and D3, the (1-1)-th layer L1 on the first dam D1 may include the first area Q1 exposing the upper surface of the first dam D1. In addition, the (1-3)-th layer L3 on the third dam D3 may include the second area Q2 exposing the upper surface of the third dam D3. The upper surface of the first dam D1 may be spaced apart from the (1-1)-th layer L1. The upper surface of the third dam D3 may be spaced apart from the (1-3)-th layer L3. The (1-2)-th layer L2 may overlap the upper surface of the second dam D2.

In addition, the (1-1)-th layer L1 overlapping the first dam D1 and the (1-2)-th layer L2 overlapping the second dam D2 may be connected to each other. The (1-2)-th layer L2 overlapping the second dam D2 and the (1-3)-th layer L3 overlapping the third dam D3 may be connected to each other. The connection shape of the first layers L1, L2, and L3 may be changed according to a position of the sacrificial layer provided during the manufacturing process. According to some embodiments, the sacrificial layer located between the dam and the dam may be omitted, and according to some embodiments, the adjacent first layers may be connected to each other as shown in FIG. 15.

In addition, according to some embodiments, a second layer M1 overlapping the second dam D2 may be further included. The second layer M1 may be manufactured in the same process as the second electrode 270, and may include the same material as the second electrode 270. An end of the second layer M1 may include burrs CB' and CB". The second electrode material layer according to some embodiments may be removed from the laser beam irradiated area regardless of the presence or absence of the sacrificial layer. In FIG. 8 described above, embodiments in which the laser beam is irradiated in the continuous area IRA have been described, but embodiments according to the present invention are not limited thereto, and the laser beam may be discontinuously irradiated. The second electrode material layer is not removed in the area in which the laser beam is not irradiated. The second electrode material layer together with the second layer M1 may remain in the area in which the laser beam is not irradiated.

FIG. 16 illustrates an image of whether carbonization occurs according to an energy density of a laser irradiated according to some embodiments. Referring to FIG. 16, the energy density of the irradiated laser beam according to some embodiments may be about 1000 mJ/cm$^2$ or less. When the energy density of the irradiated laser beam is 1000 mJ/cm$^2$ or more, particularly 1200 to 1400 mJ/cm$^2$, 1600 mJ/cm$^2$, and 1800 mJ/cm$^2$, it was confirmed that carbonization occurred in the insulation layer, the pixel definition layer, or the spacer.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims, and their equivalents.

| Description of Some of the Reference Symbols | |
|---|---|
| DTA: opening area | LA: peripheral area |
| DA: display area | 110: substrate |
| Tr: transistor | 181, 182: insulation layer |
| 191: first electrode | 360: pixel definition layer |
| 370: intermediate layer | 270: second electrode |
| D1, D2: dam | L1: first layer |
| L2: second layer | R1, R2, R3: first opening area |
| Q1: second opening area | |

What is claimed is:

1. A display device comprising:
   a substrate including an opening area, a peripheral area surrounding the opening area, and a display area surrounding the peripheral area;
   a transistor overlapping the display area on the substrate;
   an insulation layer on the transistor;
   a first electrode on the insulation layer;
   a pixel definition layer on the first electrode;
   an intermediate layer and a second electrode that overlap the first electrode and include a functional layer;
   a dam overlapping the peripheral area; and
   a first layer overlapping the peripheral area and spaced apart from the intermediate layer,
   wherein the first layer is free from overlapping at least a part of an upper surface of the dam and covers a side surface of the dam,
   wherein the first layer is disposed on a same layer as the intermediate layer.

2. The display device of claim 1, wherein an end of the first layer protrudes past an upper surface of the dam in a plan view.

3. The display device of claim 2, further comprising an encapsulation layer on the second electrode,
   wherein the encapsulation layer includes a first encapsulation inorganic layer, an encapsulation organic layer, and a second encapsulation inorganic layer, and an end of the second electrode overlaps the encapsulation organic layer.

4. The display device of claim 3, wherein the first layer includes:
a first area exposing the upper surface of the dam; and
a second area exposing a portion of the insulation layer.

5. The display device of claim 4, wherein the first encapsulation inorganic layer is in the first area on the upper surface of the dam.

6. The display device of claim 4, wherein the first encapsulation inorganic layer contacts the insulation layer exposed in the second area, and has a stepped shape.

7. The display device of claim 4, wherein the dam includes a plurality of dams having different heights.

8. The display device of claim 7, wherein the first area overlaps at least one of the plurality of dams.

9. The display device of claim 8, wherein
the display device further includes an inorganic insulation layer between the transistor and the substrate, and
the second area exposes the inorganic insulation layer.

10. The display device of claim 9, wherein ends of the substrate, the inorganic insulation layer, the first encapsulation inorganic layer, and the second encapsulation inorganic layer define an inner surface of the opening area.

11. The display device of claim 1, wherein the functional layer includes at least one of a hole injection layer, a hole transporting layer, an electron transporting layer, or an electron injection layer.

12. The display device of claim 11, wherein the first layer includes a same material as at least one of the hole injection layer, the hole transporting layer, the electron transporting layer, or the electron injection layer.

13. A display device comprising:
a substrate including an opening area, a peripheral area surrounding the opening area, and a display area surrounding the peripheral area;
a transistor on the substrate;
an insulation layer on the transistor;
a first electrode on the insulation layer;
a pixel definition layer on the first electrode;
an intermediate layer and a second electrode that overlap the first electrode and include a functional layer;
a plurality of dams in the peripheral area; and
a first layer in the peripheral area,
wherein the first layer is free from overlapping at least a part of an upper surface of at least one of the plurality of dams,
wherein the first layer is disposed on a same layer as the intermediate layer.

14. The display device of claim 13, wherein the first layer covers side surfaces of the plurality of dams.

15. The display device of claim 13, further comprising an encapsulation layer on the second electrode,
wherein the encapsulation layer includes a first encapsulation inorganic layer, an encapsulation organic layer, and a second encapsulation inorganic layer, and
the first encapsulation inorganic layer contacts upper surfaces of the plurality of dams in the peripheral area.

16. The display device of claim 15, wherein the first layer includes an end protruding from the upper surface of the dam.

17. The display device of claim 16, wherein the first layer includes a first area exposing the upper surface of the dam in the peripheral area.

18. The display device of claim 17, wherein the first encapsulation inorganic layer contacts the end of the first layer and the upper surface of the dam in the first area, and has a stepped shape.

19. The display device of claim 17, wherein the first layer includes a second area exposing at least a portion of the insulation layer in the peripheral area.

20. The display device of claim 19, wherein the first encapsulation inorganic layer contacts the insulation layer exposed in the second area, and has a stepped shape.

* * * * *